(12) United States Patent
Lawson et al.

(10) Patent No.: US 9,202,001 B1
(45) Date of Patent: Dec. 1, 2015

(54) SYSTEM AND METHOD FOR ELECTRONIC DESIGN ROUTING BETWEEN TERMINALS

(71) Applicant: Cadence Design Systems, Inc., San Jose, CA (US)

(72) Inventors: Randall Scott Lawson, Seabrook, NH (US); Brett Allen Neal, Monument, CO (US); Donald Keith Morgan, Chelmsford, MA (US); Jelena Radumilo-Franklin, Westford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 21 days.

(21) Appl. No.: 13/682,036

(22) Filed: Nov. 20, 2012

(51) Int. Cl.
G06F 17/50 (2006.01)
(52) U.S. Cl.
CPC ........ G06F 17/5077 (2013.01); G06F 17/5081 (2013.01); G06F 17/5054 (2013.01); G06F 17/5068 (2013.01)

(58) Field of Classification Search
None
See application file for complete search history.

(56) References Cited

U.S. PATENT DOCUMENTS

| | | | |
|---|---|---|---|
| 7,536,665 B1 * | 5/2009 | Horlick et al. | 716/126 |
| 7,793,249 B1 * | 9/2010 | Wadland et al. | 716/129 |
| 7,937,681 B2 | 5/2011 | Wadland et al. | |
| 8,464,196 B1 * | 6/2013 | Lawson et al. | 716/126 |
| 8,910,105 B1 * | 12/2014 | Lawson et al. | 716/126 |

* cited by examiner

Primary Examiner — A. M. Thompson
(74) Attorney, Agent, or Firm — Holland & Knight LLP; Mark H. Whittenberger, Esq.

(57) ABSTRACT

The present disclosure relates to a computer-implemented method for routing in an electronic circuit design. The method may include assigning a plurality of rats interconnecting one or more terminals associated with a layout of the electronic circuit design to a bundle. The method may further include sequencing the plurality of rats within the assigned bundle to generate a defined sequence of rats within the assigned bundle. The method may also include routing the plurality of rats between the one or more terminals, based upon, at least in part, the defined sequence.

21 Claims, 27 Drawing Sheets

SYSTEM AND METHOD FOR ELECTRONIC DESIGN ROUTING BETWEEN TERMINALS

FIELD OF THE INVENTION

The present disclosure relates to electronic design automation (EDA), and more specifically, to a method for automatically routing paths for interconnections between terminals of interoperable components associated with an electronic design simulation.

DISCUSSION OF THE RELATED ART

EDA utilizes software tools that may be used in the design and analysis of numerous electronic systems such as printed circuit boards (PCBs) and integrated circuits (ICs). Recent years have seen unprecedented expansion of functional requirements for PCB designs. PCB designers must now cope with a myriad of interconnect topologies and logic signal levels, and must be constantly keen to tolerance stack-up and to implications to signal integrity of an evolving placement/interconnect solution. Designers must balance dozens of variables that may resolve into hundreds of valid and invalid solutions without any real guidance from the available tools toward selecting the best solution. EDA customers have responded to these shortcomings by demanding more route engine power, interactive functionality and diverse capabilities from their CAD tools. Currently, users solve difficult routing problems interactively through a manual CAD editing environment according to a tedious manual process. Certain connections are selected, some portion of the path for these connections is routed, problems are located and resolved, and the process is iterated until done. This is an extremely slow and arduous process and, because the PCB design is typically the last stage in the production of a new product, time-to-market for the entire product is adversely affected. Traditionally, PCB autorouters have allowed the user only limited control over the routing process and limited ability to influence autorouting decisions. There have been some mechanisms by which users can force certain paths to be preserved or to restrict routing to certain regions. It is quite apparent, though, that as PCB complexity continues to soar, more and more designs will be beyond the limit of the current generation of autorouting tools.

SUMMARY OF INVENTION

In one or more embodiments of the present disclosure, a computer-implemented method for routing in an electronic circuit design. The method may include assigning a plurality of rats interconnecting one or more terminals associated with a layout of the electronic circuit design to a bundle. The method may further include sequencing the plurality of rats within the assigned bundle to generate a defined sequence of rats within the assigned bundle. The method may also include routing the plurality of rats between the one or more terminals, based upon, at least in part, the defined sequence.

One or more of the following features may be included. In some embodiments, the method may include providing a user with an option associated with the defined sequence, the option including at least one of creating, deleting, and manipulating the defined sequence. The method may also include determining if the defined sequence satisfies at least one design rule. The method may further include providing a user with a routing option associated with the electronic circuit design, the routing option including at least one of a manual routing option, an automatic routing option, and a hybrid routing option. The method may additionally include providing a user with an option to select at least one of a pin, via, rat, and cline associated with the defined sequence. The method may further include providing a user with an option to associate a shape with at least one aspect of the defined sequence. In some embodiments, sequencing may include generating a display configured to indicate at least one crossing pattern associated with the defined sequence prior to routing.

In some embodiments, a computer-readable storage medium for electronic design simulation is provided. The computer-readable storage medium may have stored thereon instructions that when executed by a machine result in one or more operations. Operations may include assigning a plurality of rats interconnecting one or more terminals associated with a layout of the electronic circuit design to a bundle. Operations may further include sequencing the plurality of rats within the assigned bundle to generate a defined sequence of rats within the assigned bundle. Operations may also include routing the plurality of rats between the one or more terminals, based upon, at least in part, the defined sequence.

One or more of the following features may be included. In some embodiments, operations may include providing a user with an option associated with the defined sequence, the option including at least one of creating, deleting, and manipulating the defined sequence. Operations may also include determining if the defined sequence satisfies at least one design rule. Operations may further include providing a user with a routing option associated with the electronic circuit design, the routing option including at least one of a manual routing option, an automatic routing option, and a hybrid routing option. Operations may additionally include providing a user with an option to select at least one of a pin, via, rat, and cline associated with the defined sequence. Operations may further include providing a user with an option to associate a shape with at least one aspect of the defined sequence. In some embodiments, sequencing may include generating a display configured to indicate at least one crossing pattern associated with the defined sequence prior to routing.

In one or more embodiments of the present disclosure, a system may include a computing device having at least one processor configured to assign a plurality of rats interconnecting one or more terminals associated with a layout of the electronic circuit design to a bundle. The at least one processor may be further configured to sequence the plurality of rats within the assigned bundle to generate a defined sequence of rats within the assigned bundle. The at least one processor may be further configured to route the plurality of rats between the one or more terminals, based upon, at least in part, the defined sequence.

One or more of the following features may be included. In some embodiments, the at least one processor may be further configured to provide a user with an option associated with the defined sequence, the option including at least one of creating, deleting, and manipulating the defined sequence. The at least one processor may be further configured to determine if the defined sequence satisfies at least one design rule. The at least one processor may be further configured to provide a user with a routing option associated with the electronic circuit design, the routing option including at least one of a manual routing option, an automatic routing option, and a hybrid routing option. The at least one processor may be further configured to provide a user with an option to select at least one of a pin, via, rat, and cline associated with the defined sequence. The at least one processor may be further configured to provide a user with an option to associate a shape with at least one aspect of the defined sequence. In some embodiments, sequencing may include generating a display configured to indicate at least one crossing pattern associated with the defined sequence prior to routing.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Figure 1:
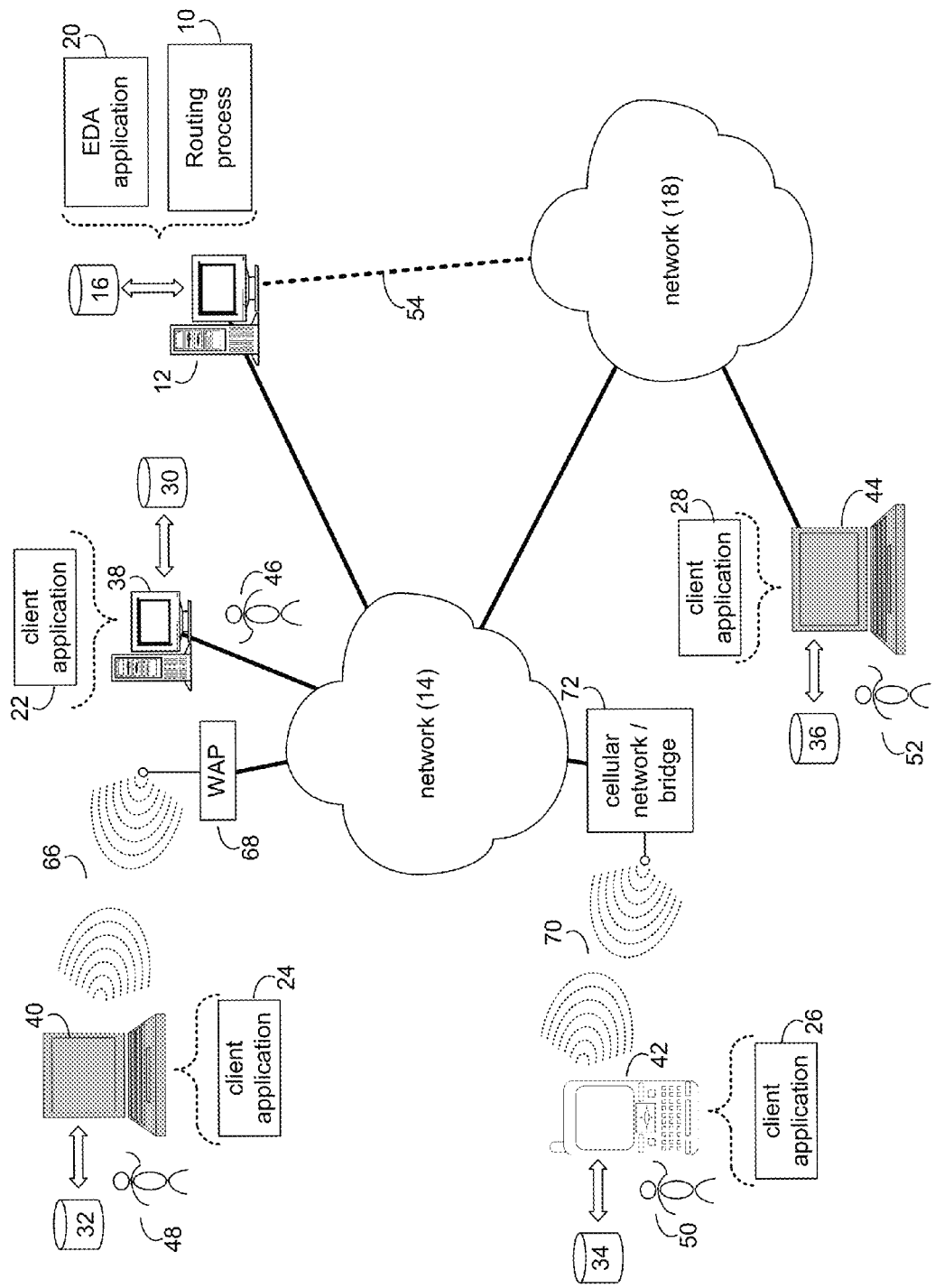
FIG. 1 is a system diagram depicting aspects of the routing process in accordance with an embodiment of the present disclosure.

Referring to FIG. 1, there is shown routing process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the report generation process may reside on and be executed, in whole or in part, by a client electronic device, such as a personal computer, notebook computer, personal digital assistant, or the like.

The instruction sets and subroutines of routing process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Routing process 10 may be a stand alone application, or may be an applet/application/script that may interact with and/or be executed within EDA application 20. In addition/as an alternative to being a server-side process, the browsing process may be a client-side process (not shown) that may reside on a client electronic device (described below) and may interact with an EDA client application (e.g., one or more of EDA client applications 22, 24, 26, 28). Further, the browsing process may be a hybrid server-side/client-side process that may interact with EDA application 20 and an EDA client application (e.g., one or more of client applications 22, 24, 26, 28). As such, the browsing process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize routing process 10 and routing process 400.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

As is used in the art, a "Design" may refer to an Electronic Design Automation (EDA) database of information describing a Printed Circuit Board (PCB), an Integrated Circuit (IC) or an IC Package. A graphical representation of a portion of a Design is illustrated at 100 in FIGS. 2A-2B. A "Terminal" 105 may refer to a location on one or more layers of a Design to which electrical signals may be connected. For a PCB, Terminals may correspond to the pins, pads, and balls of the elements in the circuit. For an IC Package, Terminals are typically IC bumps or package balls. A Terminal may also be a junction point, such as a virtual pin or a T-junction. Multiple Terminals that are grouped together, such as depicted at 110, will be referred to as a "Component".

Figure 2A:
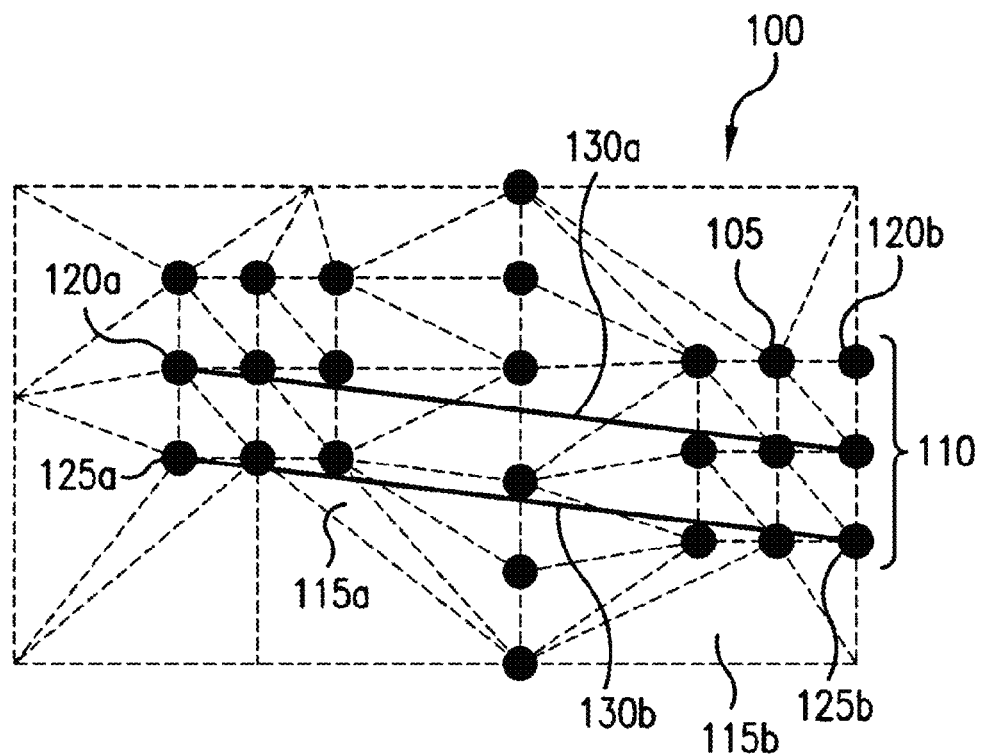
FIGS. 2A and 2B show schematics depicting aspects of the routing process in accordance with an embodiment of the present disclosure.
Figure 2B:
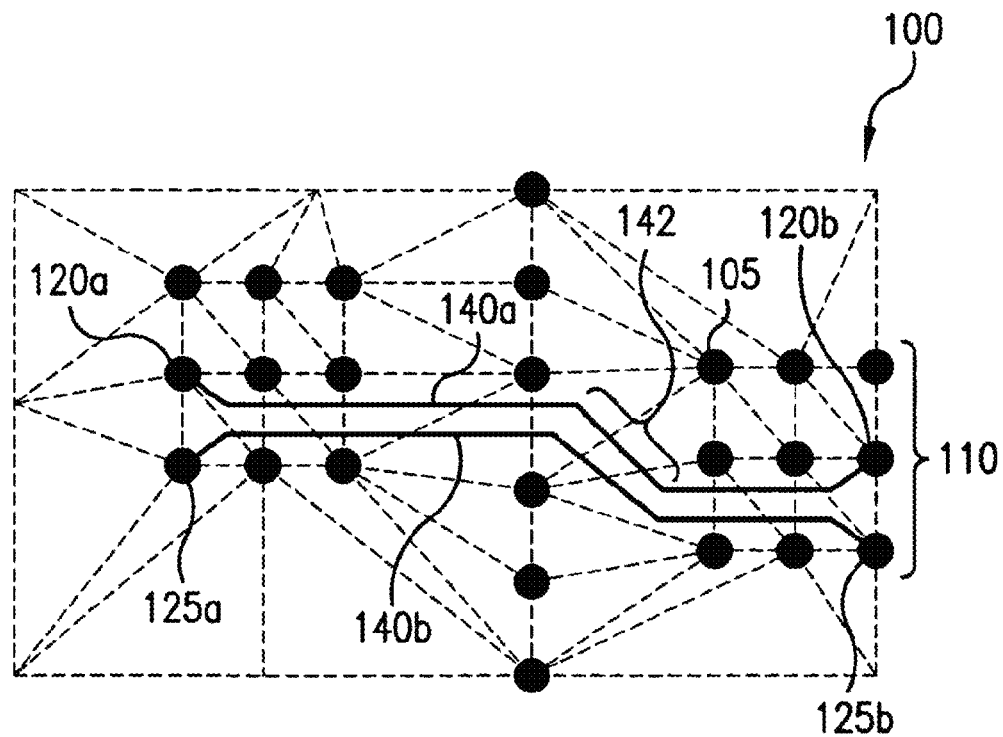

In FIGS. 2A-2B, there is shown a "Tessellation" of Design 100, i.e., the separation of the entire design space into distinct, non-overlapping regions, such as those shown at 115*a* and 115*b*. The regions in the example embodiments described herein are triangular, but it is to be understood that the regions may be formed of other polygonal shapes, such as the rectangular regions of tessellation employed in traditional autorouters.

As used herein, the term "Rat" may refer to a connection between two Terminals, i.e., a "Source Terminal" 120*a*, 125*a* and a "Target Terminal" 120*b*, 125*b*. A Rat may be unrouted, as shown at 130*a*, 130*b* of FIG. 2A, where the Rat has yet to possess geometric information defining its precise path in the Design, or a Rat can be routed as shown at 140*a*, 140*b* of FIG. 2B, where the Rat has complete geometric information specifying its ordered sequence of "Segments", an example of which is shown at 142. The Segment ordering is typically indexed or referenced starting at the Source Terminal 120*a*, 125*a* and ending at the Target Terminal 120*b*, 125*b*.

As used herein, the term "Net" may refer to a collection of Rats connecting a collection of Terminals. In some cases, the specific connections between Terminals formed by certain Rats are predetermined. In other cases, the Rats may be assembled into a Net in an order or "sequence" that is either established by the autorouter or is constrained by certain rules. For example, in the absence of any connectivity rules, the autorouter can change the collection of Rats as needed, provided the new collection still connects all of the Terminals of the Net.

Figure 3:
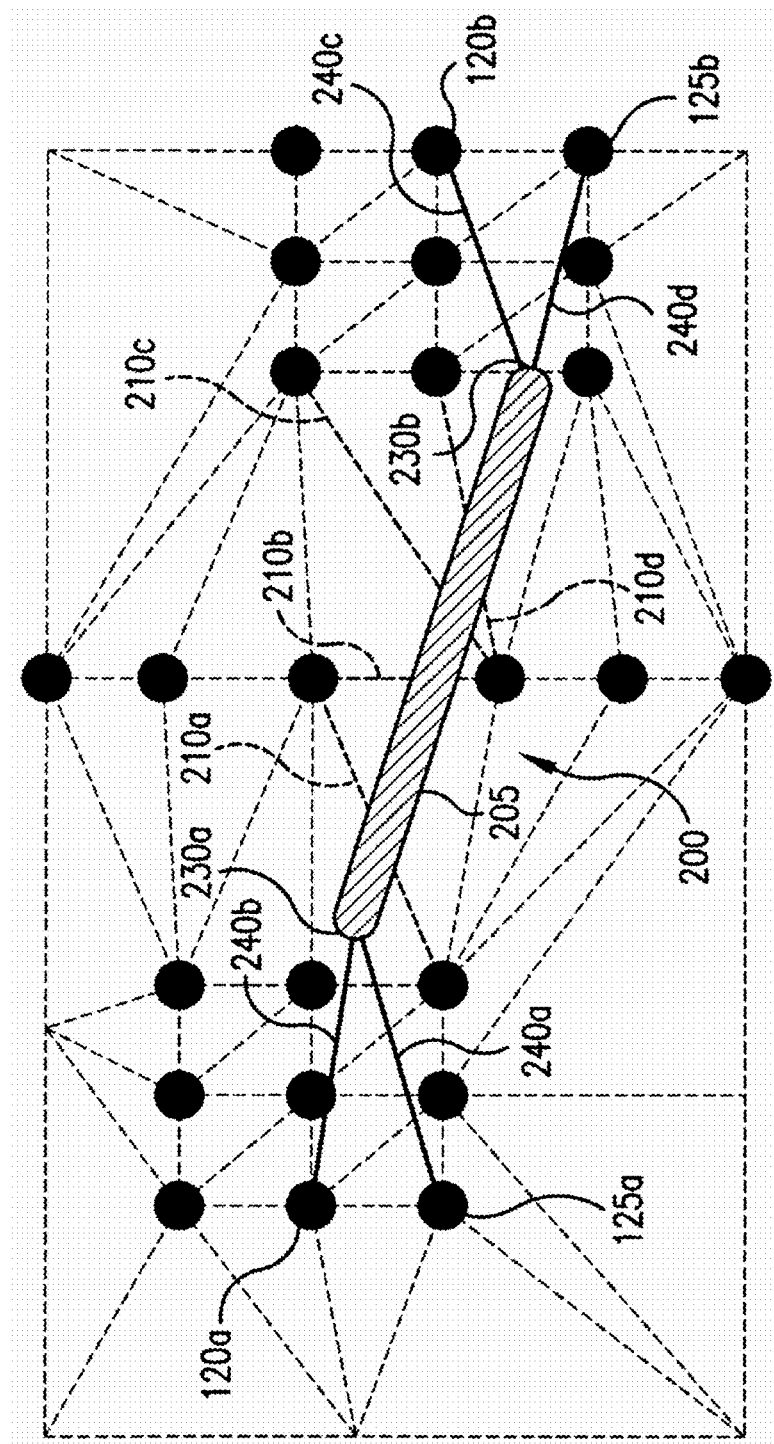
FIG. 3 is a schematic depicting aspects of the routing process in accordance with an embodiment of the present disclosure.

Referring now to FIG. 3, there is shown a "Bundle" 200, which, in accordance with the present disclosure, may refer to a collection of Rats determined by the designer or the autorouter to be routed together. In certain embodiments, a Bundle is displayed as a "Fat Rat", which, as described above, may include a wide line indicating more than one Rat. The Fat Rat may include a plurality of "Rake Lines" 240*a*-240*d* extending therefrom. The Rake Lines 240*a*-240*d* graphically connect the Terminals 120*a*-120*b* and 125*a*-125*b* of the Rats 130*a*-130*b* to the Fat Rat 205 at a common location, referred to herein as a "Gather Point", as shown at 230*a* and 230*b*.

In accordance with the present disclosure, a "Flow" may refer to a path for a Bundle, such as that illustrated by the traversal of Fat Rat 205 in FIG. 3. A Flow may be either active or inactive. An "Inactive Flow" is for graphical display purposes only and has no effect on autorouting, whereas an "Active Flow" may provide geometric input to the autorouter to be used when autorouting Rats in that Bundle.

Figure 4:
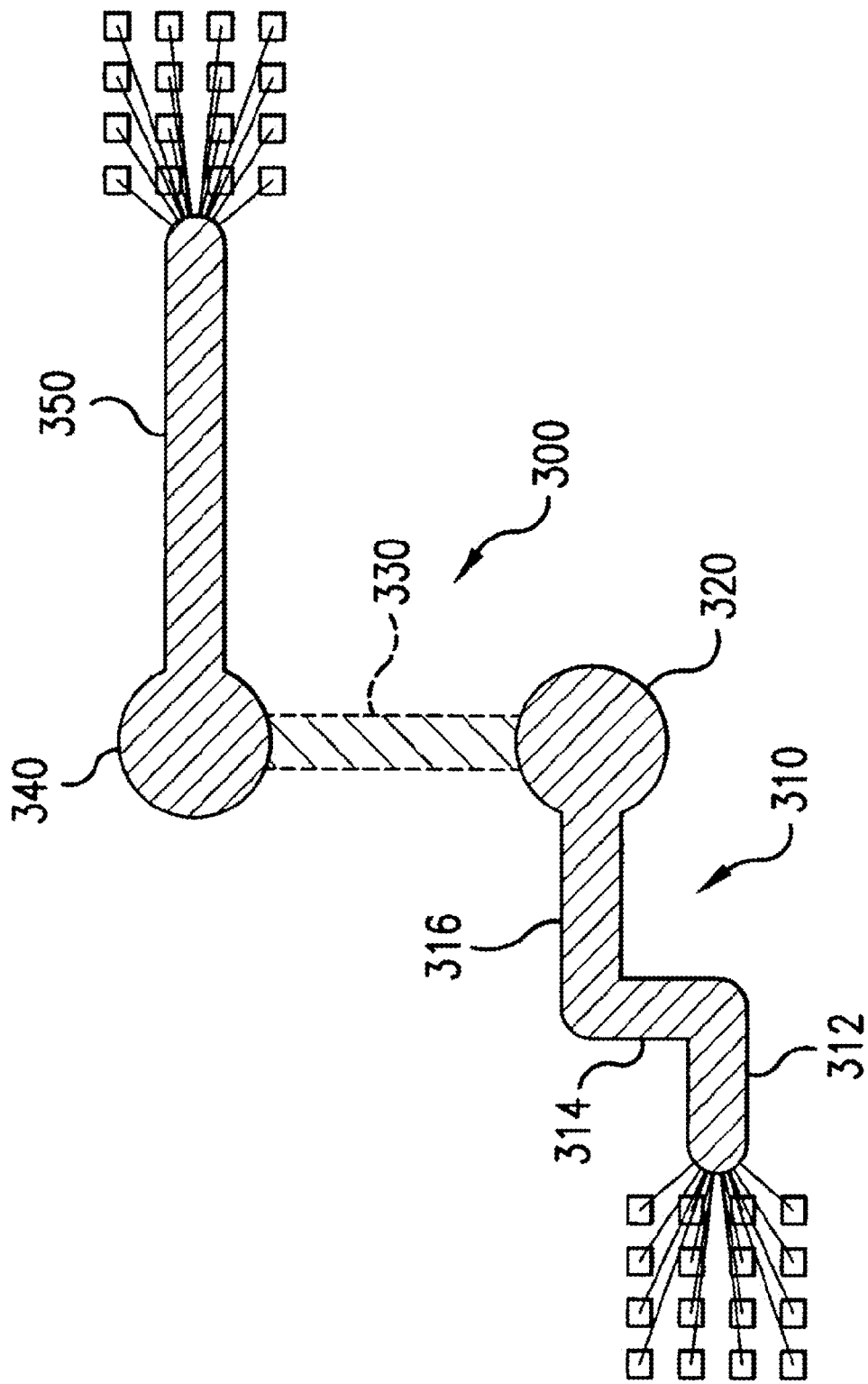
FIG. 4 is a schematic depicting aspects of the routing process in accordance with an embodiment of the present disclosure.

Referring to FIG. 4, it is illustrated that a Flow includes one or more "Flow Lines" 310, 330 and 350 connected by zero or more "Flow Vias" 320, 340. A Flow Via may indicate where vias should be placed when a Rat path needs to change routing layers. Each Flow Line may include one or more "Flow Segments", such as those illustrated at 312, 314 and 316 of Flow Line 310.

As used herein, the term "Portal", may refer to a side of a tessellation region and is often referred to in topological fields as an edge or a cut. In FIG. 3, the Portals shown at 210*a*-210*d* are traversed by the Flow indicated by the Fat Rat 205. It is to be noted that Terminals may or may not be on a boundary formed by the Portals.

Figure 5A:
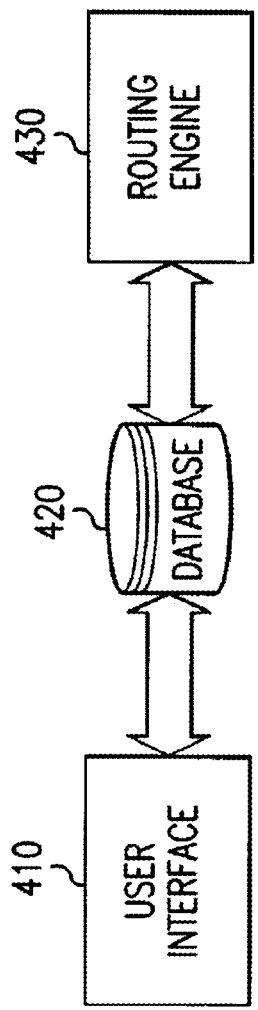
FIGS. 5A and 5B show schematics depicting aspects of the routing process in accordance with an embodiment of the present disclosure.
Figure 5B:
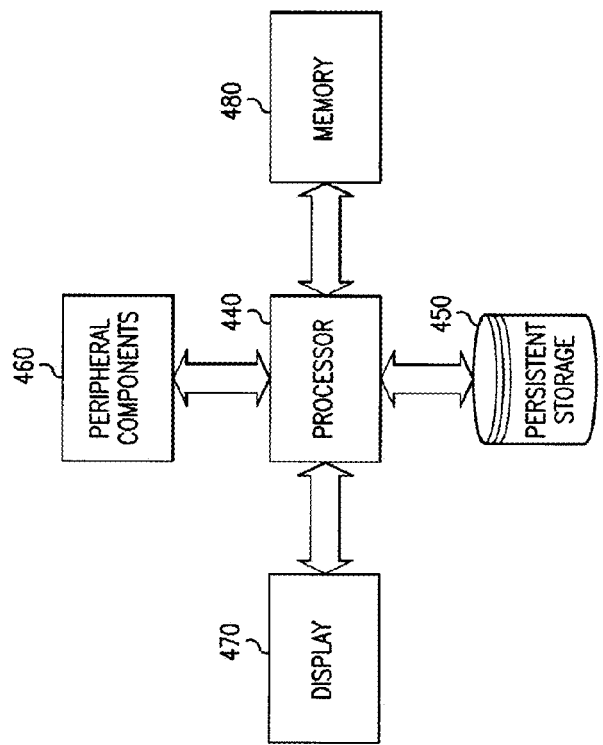

An example embodiment depicting functional modules operable to carry out the present disclosure are illustrated in FIG. 5A and may be implemented in suitable computing hardware such as that depicted in FIG. 5B. The data defining one or more Designs may be maintained in database 420 and may be presented to a user as one or more abstractions of that data through a user interface 410. A data abstraction may refer to a conceptualization of the data reduced or factored so that a user can focus on only few pertinent aspects thereof. This is useful in circuit design in that the data may be viewed in a manner appropriate to the work task at hand. For example, an IC is generally viewed by a simple block symbol during a Component placement task and is viewed as an arrangement of its Terminals in a routing task. Through these data abstractions, the user may be relieved of having to place and route the circuit in a view cluttered by the IC's constituent components, i.e., the thousands and possibly millions of transistors, resistors and other circuit elements forming the IC.

Database 420 implements a suitable structure on, for example, persistent storage system 450, for retaining data so as to be retrieved by its numerous data abstractions. Additionally, the database 420 is operable to store data that has been modified through any of its abstractions.

User interface 410 may be implemented through processor instructions stored in memory system 470 and executed by a suitable processor 440. User interface 410 may be a graphical user interface operable to display the Design on a display 470 and to allow the user to add, delete and modify features of the Design through, for example, manipulation of certain peripheral components 460 coupled to processor 440.

Routing engine 430 may execute path finding procedures to interconnect the Terminals of a Design. Routing engine 430 may be implemented through processor instructions stored in memory system 470 and executable by processor 440. The present disclosure is not limited to any specific router implementation. However, in one particular embodiment, the routing engine 430 may embody a "costed-wavefront" path finding mechanism. In such a router, paths may be selected for each Rat by expanding through each tessellated region of the Design starting at its associated Source Terminal. Each expansion forwards the Rat from one tessellated region to an adjacent region at an associated "cost" for the expansion. The cost for the expansion is a numeric value indicative of the relative difficulty of geometrically installing the path in the Design. The lowest cost sequence of such expansions from the Source Terminal (or an equivalent Source Terminal) to the Target Terminal (or an equivalent Target Terminal) is selected as the path for that Rat.

Figure 6:
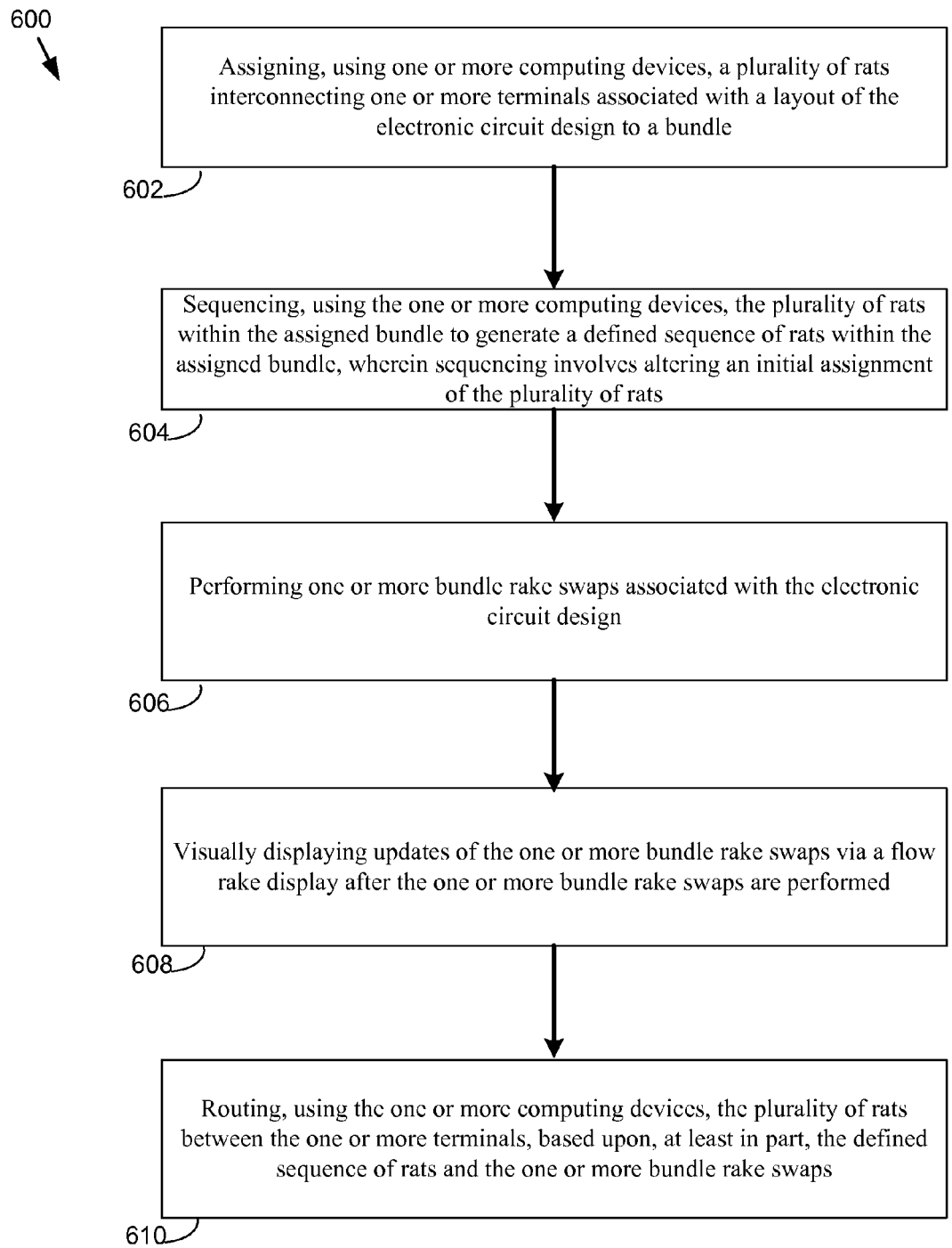
FIG. 6 is a flowchart depicting operations consistent with the routing process of the present disclosure.

As shown in FIG. 6, and as will be discussed in further detail below, routing process 10 may include assigning (602) a plurality of rats interconnecting one or more terminals associated with a layout of the electronic circuit design to a bundle. The method may further include sequencing (604) the plurality of rats within the assigned bundle to generate a defined sequence of rats within the assigned bundle. The method may also include routing (606) the plurality of rats between the one or more terminals, based upon, at least in part, the defined sequence.

Embodiments of the routing process disclosed herein may be used to address problems associated with the creation of intelligent breakouts. A user may need to be able to select pins, vias, existing track, rats, bundles or flows and auto-interactively produce intelligent breakouts in a timely manner that will greatly contribute to the success of the final trunk route.

Some existing techniques involve the use of a ratsnest display. Other existing techniques may use a combination of a ratsnest display and the teachings of bundles and flows as discussed in U.S. Pat. No. 7,536,665, assigned to the assignee of the present disclosure, which is incorporated by reference in its entirety.

Figure 7:
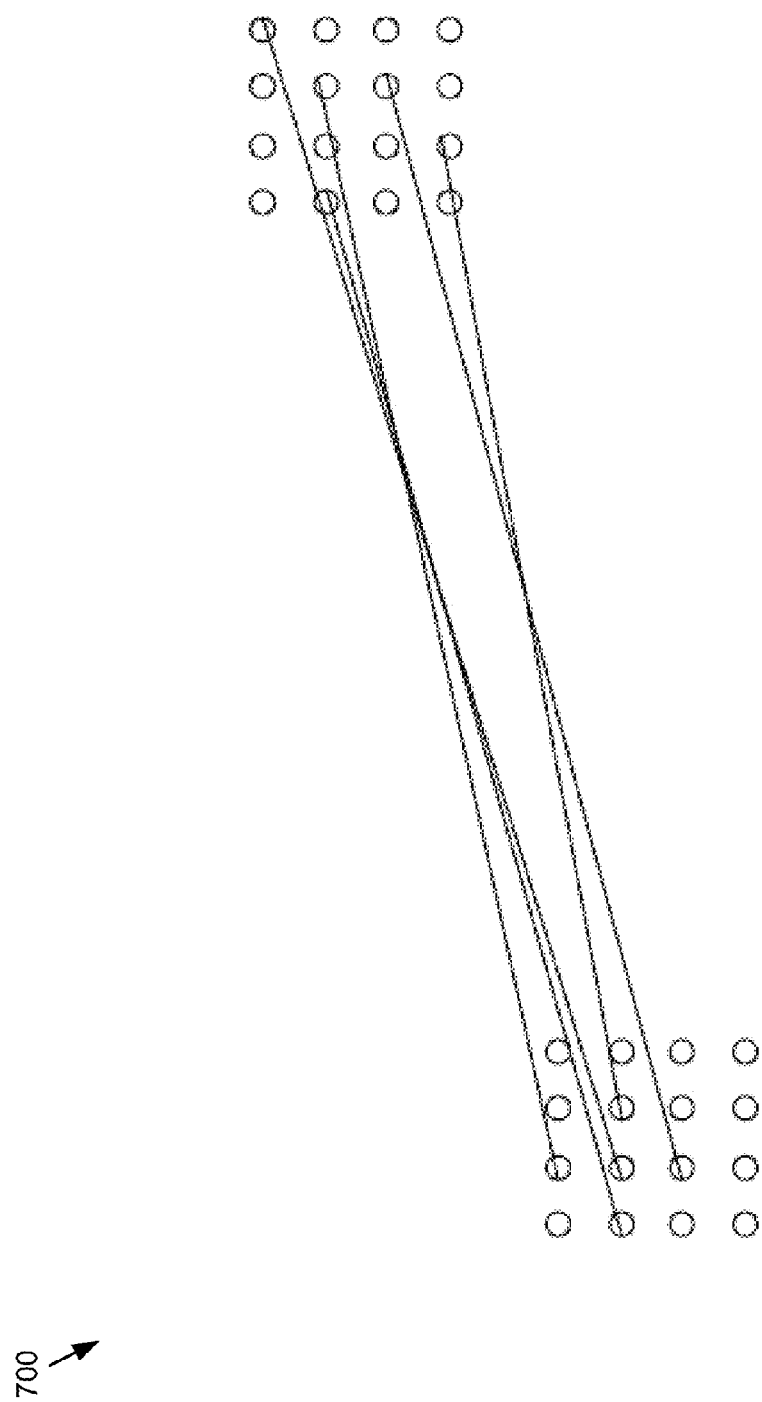
FIG. 7 is a schematic depicting aspects of the routing process in accordance with an embodiment of the present disclosure.
Figure 8:
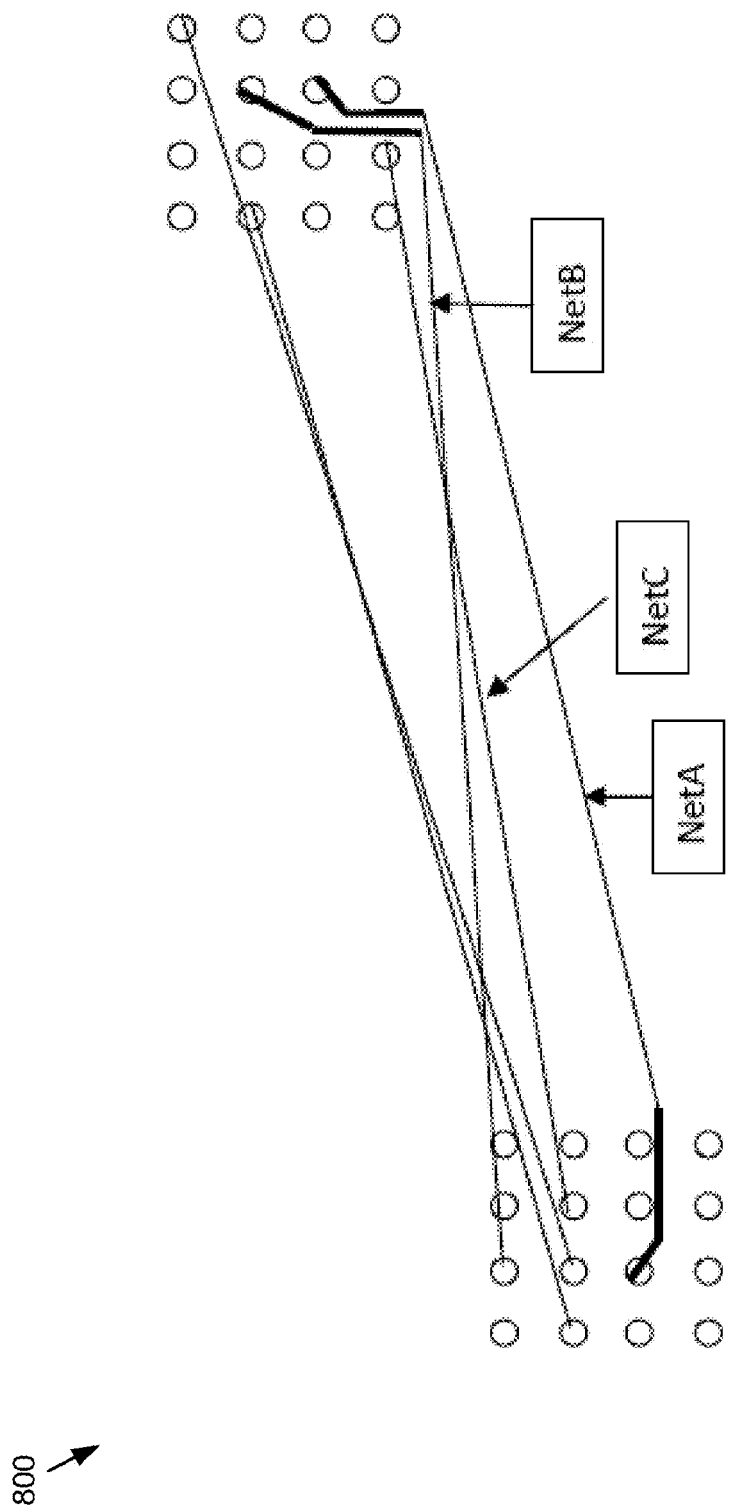
FIG. 8 is a schematic depicting aspects of the routing process in accordance with an embodiment of the present disclosure.
Figure 9:
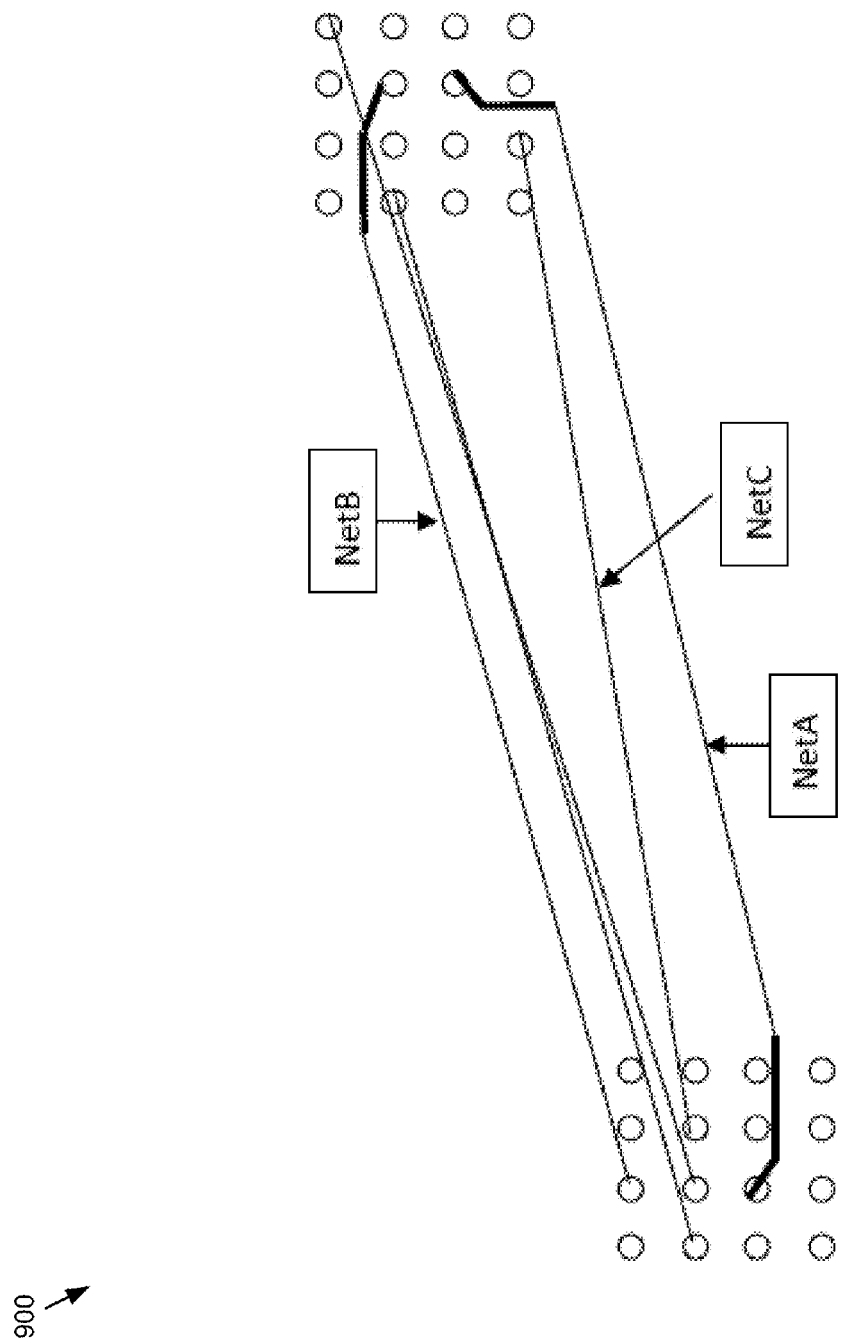
FIG. 9 is a schematic depicting aspects of the routing process in accordance with an embodiment of the present disclosure.

Referring now to FIG. 7, an embodiment depicting a ratsnest display is provided. Accordingly, using the ratsnest display approach, the user may utilize etch editing tools to manually stitch in traces. The process is tedious and often requires rework of previously installed traces since it is difficult from the ratsnets display to determine the sequence to route out of the component. As the user routes connections out of the component, the ratsnest updates to the end of the connections as is shown in FIG. 8. As the user routes each connection, they realize they have to re-route previous ones as is shown in FIG. 9. The user may have re-routed NetB because it would have crossed NetC. This process continues until all routes have escaped the edge of the components.

Figure 10:
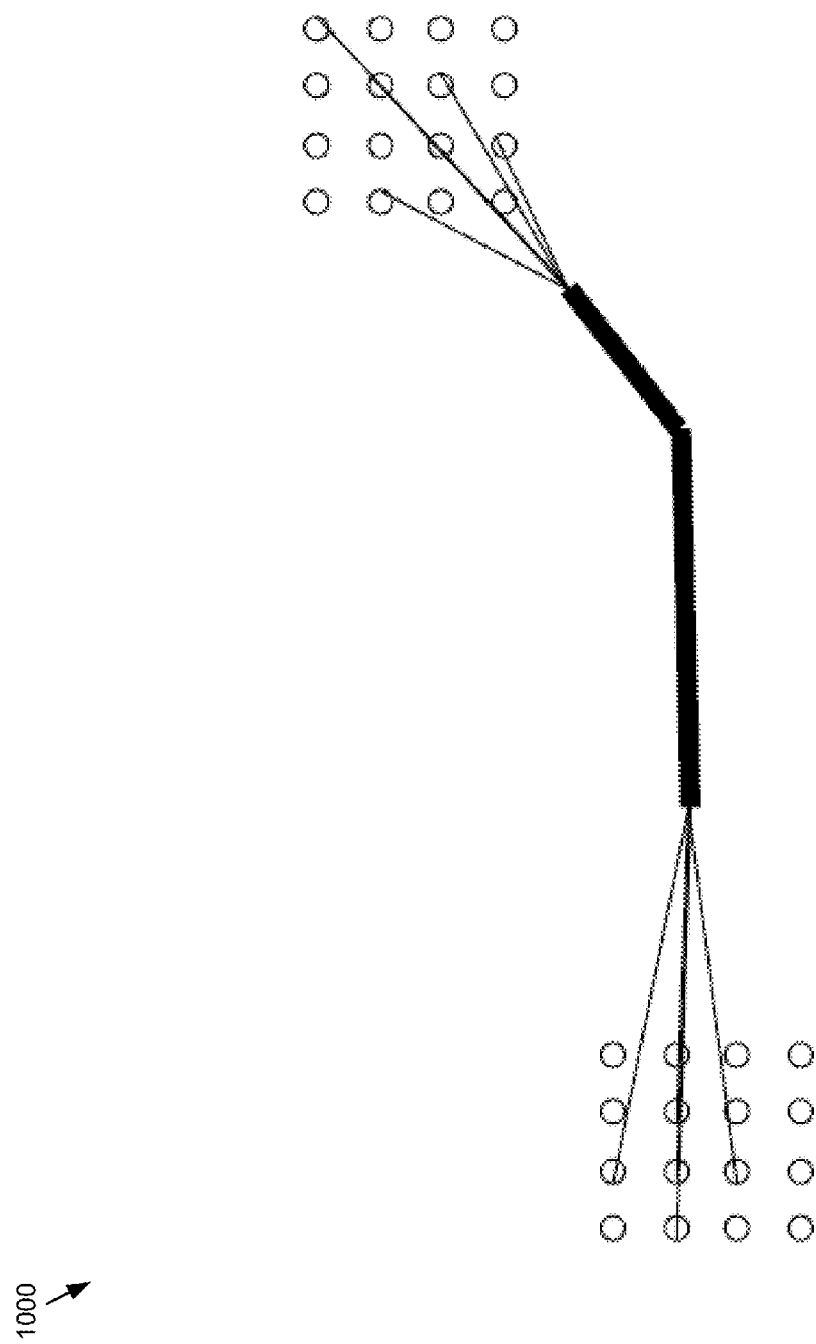
FIG. 10 is a schematic depicting aspects of the routing process in accordance with an embodiment of the present disclosure.
Figure 11:
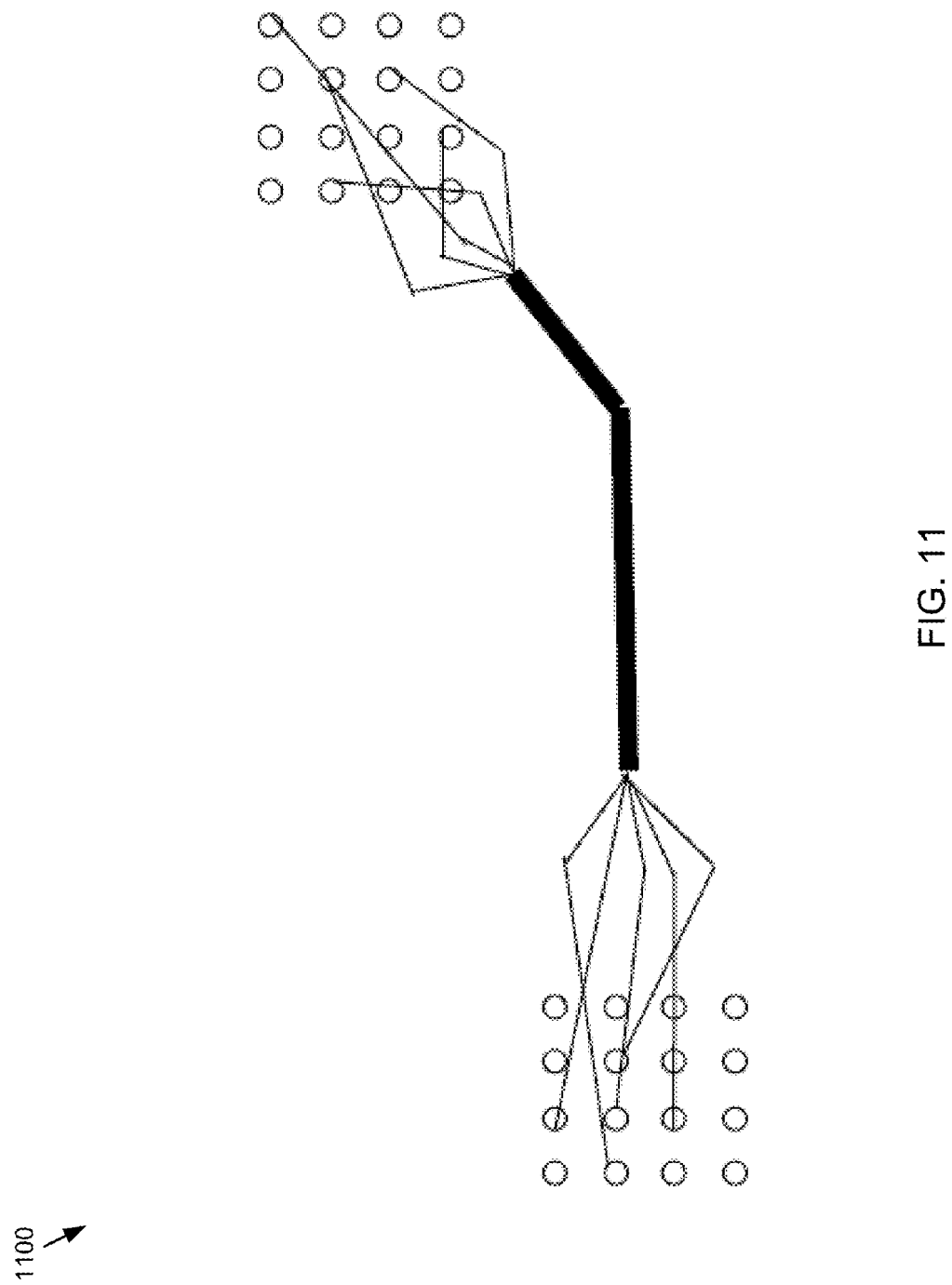
FIG. 11 is a schematic depicting aspects of the routing process in accordance with an embodiment of the present disclosure.
Figure 12:
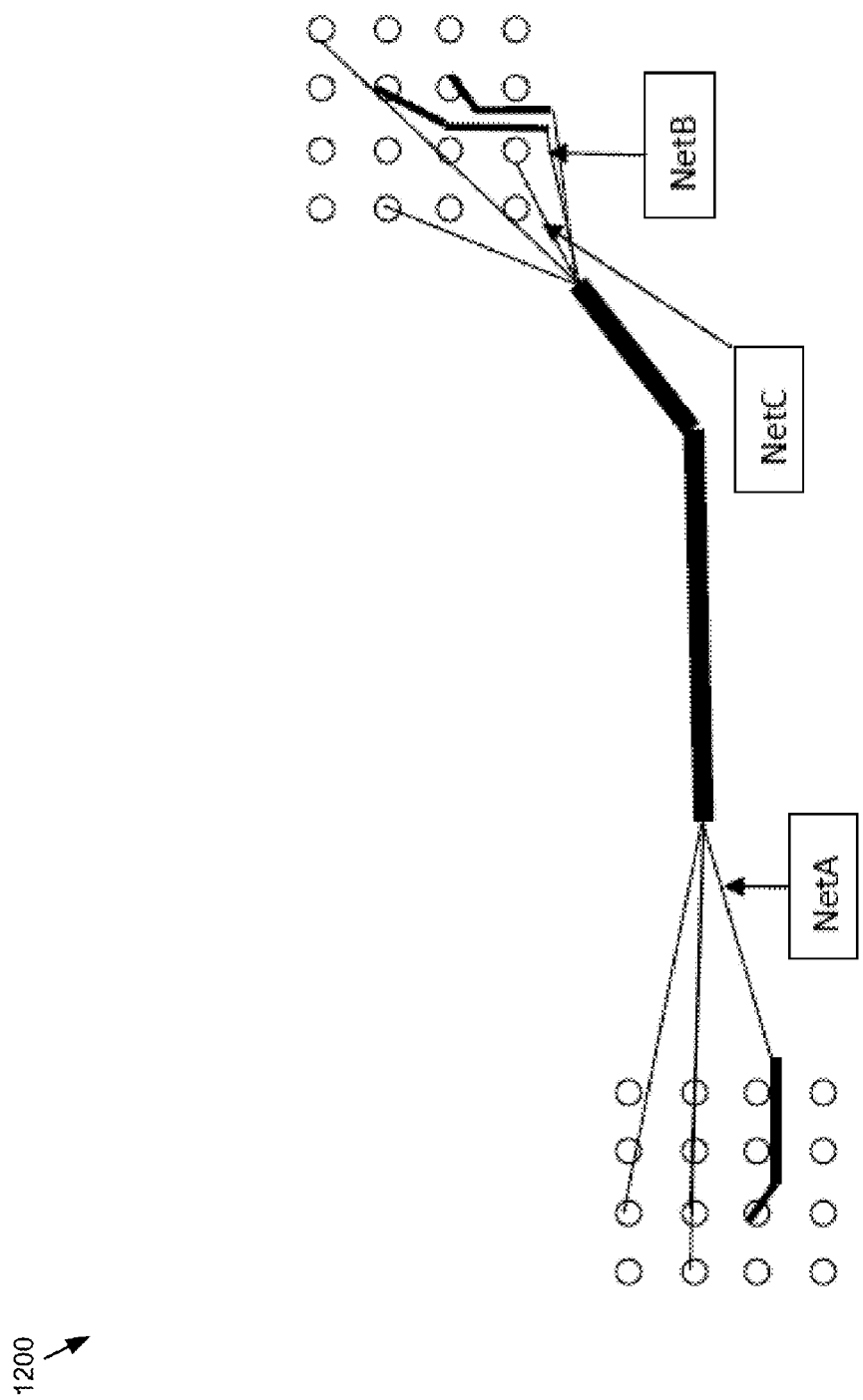
FIG. 12 is a schematic depicting aspects of the routing process in accordance with an embodiment of the present disclosure.
Figure 13:
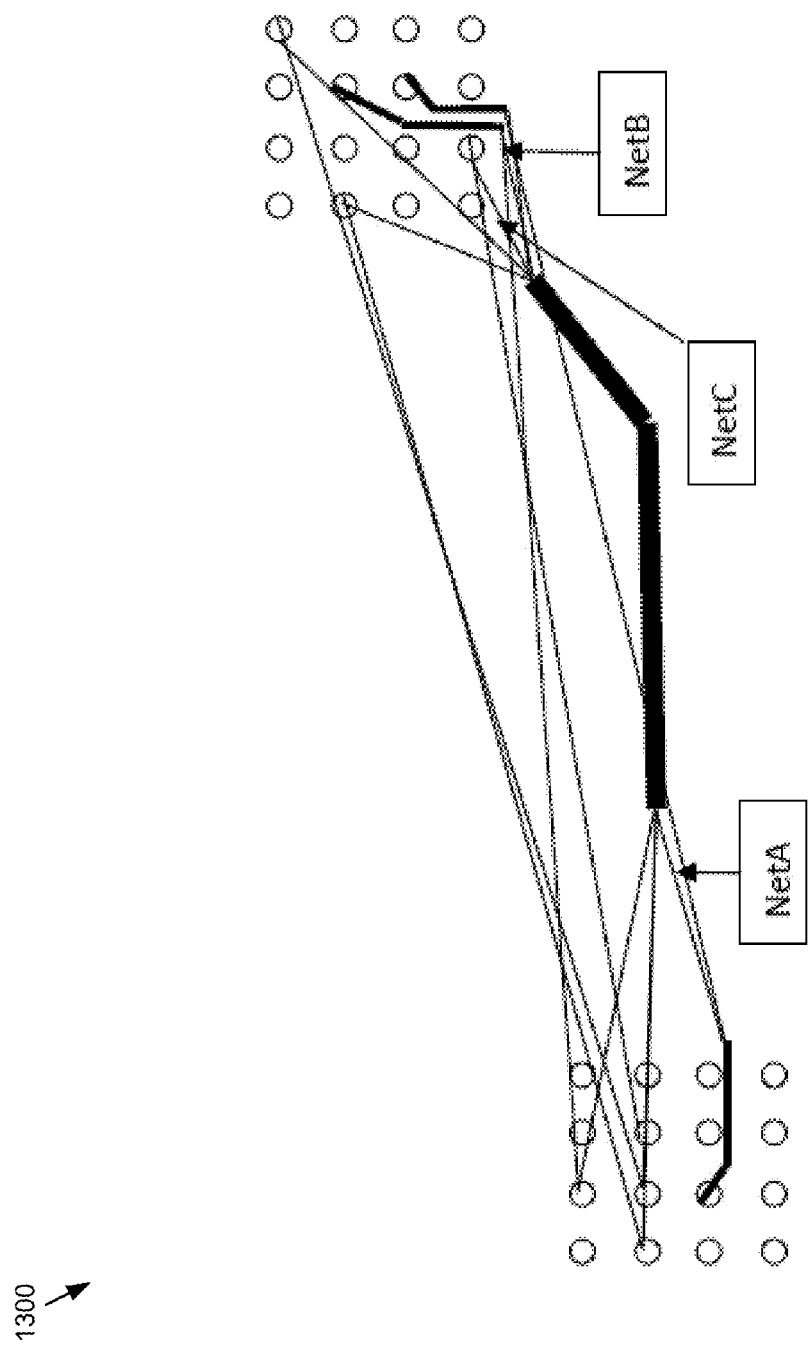
FIG. 13 is a schematic depicting aspects of the routing process in accordance with an embodiment of the present disclosure.

Additionally and/or alternatively, when using a combination of a ratsnest display and the teachings of bundles and flows as discussed in U.S. Pat. No. 7,536,665, the user may utilize etch editing tools to manually stitch in traces. The process is tedious and often requires rework of previously installed traces since it is difficult from the flow rake display to determine the sequence to route out of the component as is shown in FIG. 10. The expanded flow rake display provides added information about potential crosses, but is still not accurate enough to show how to route the design correctly the first time as is shown in FIG. 11. As the user routes connections out of the component, the ratsnest updates to the end of the connection as is shown in FIG. 12. As the user routes each connection, they may encounter difficulty seeing the crosses with only the flow on, which may require activation of the ratsnest as well. This becomes difficult to visualize, but the user hopefully is able to see the cross between NetB and other net as is shown in FIG. 13. This process continues until all routes have escaped the edge of the components.

Figure 14:
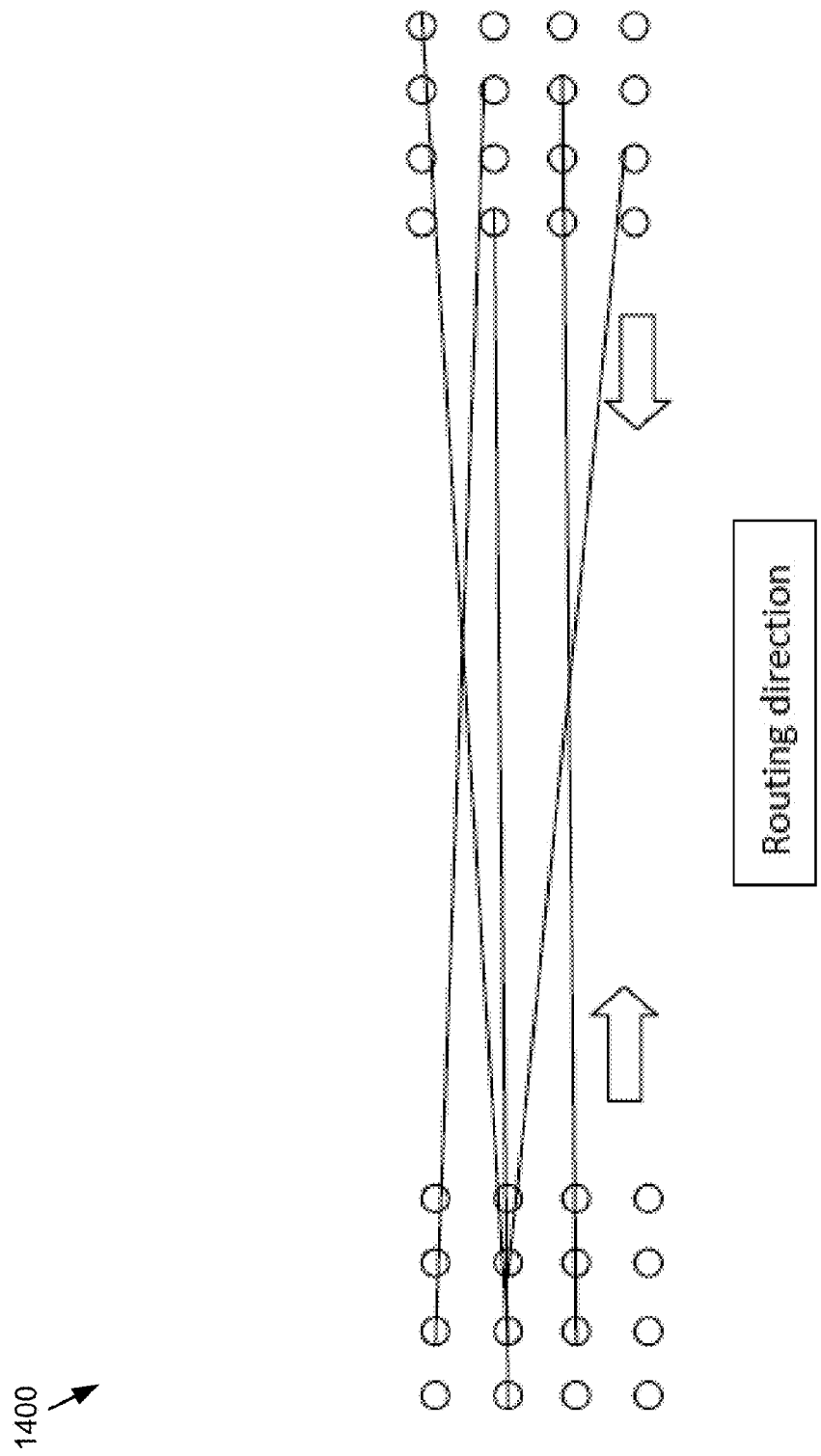
FIG. 14 is a schematic depicting aspects of the routing process in accordance with an embodiment of the present disclosure.
Figure 15:
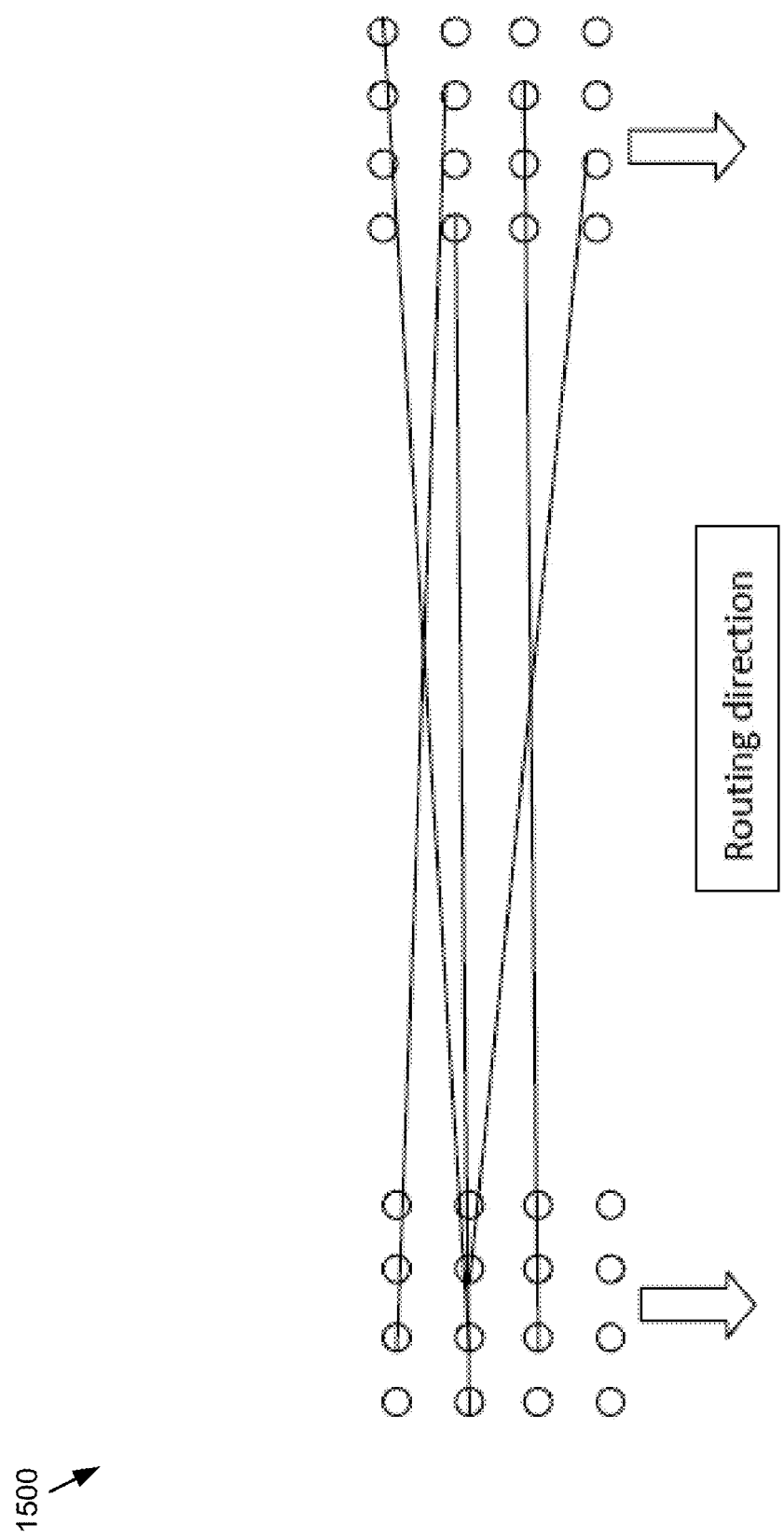
FIG. 15 is a schematic depicting aspects of the routing process in accordance with an embodiment of the present disclosure.
Figure 16:
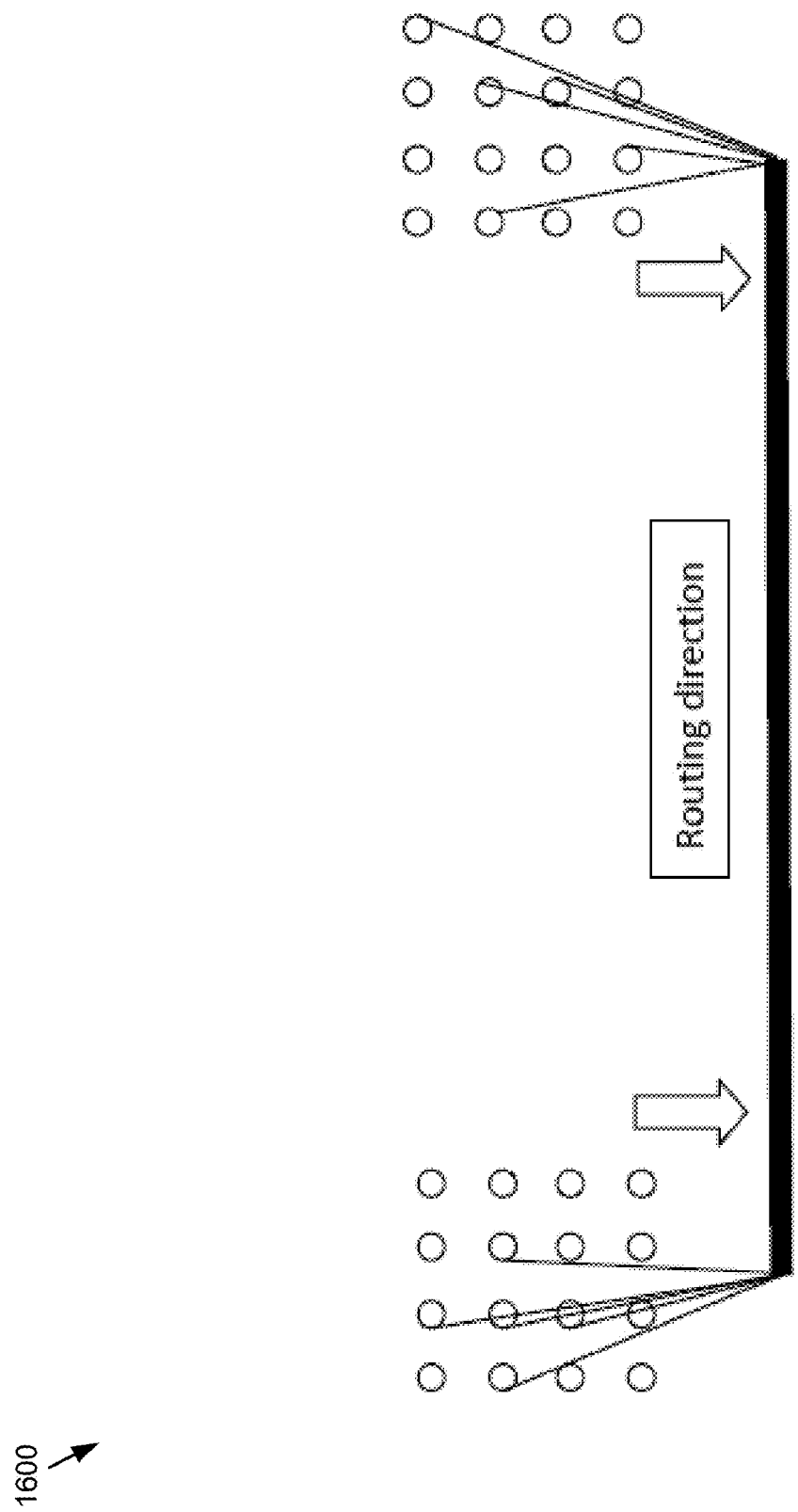
FIG. 16 is a schematic depicting aspects of the routing process in accordance with an embodiment of the present disclosure.

The ratsnest display approach may work best when all of the rats are going in the same direction as the actual routing as shown in FIG. 14. When there are two horizontally placed components with the required routing exiting from the bottom, the ratsnest display is not very useful as shown in FIG. 15. The flow display is also not very useful with the chosen component orientation and route direction as shown in FIG. 16.

Accordingly, embodiments of routing process 10 described herein may address many of the issues that users have encountered in the past. Some benefits may include, but are not limited to, the ability to interactively define and modify the flow sequence, to automatically generate an initial sequence, to clearly see crosses and potential crosses without requiring any routing, to define a sequence for each layer of a multi-layer bundle, to define the direction out of the component the routing should follow, to interactively define and modify diffpair orientation/pad entry using sequence, to see automatic updates of rakes when flow sequence changes, to see automatic updates of rakes after pin swaps are performed, to see automatic updates of rakes as routes are created, to have automatic routing strictly adhere to the defined flow sequence, to define the distance outside the component the sequence route will extend in automatic Mode, to define the shape of the object that the sequence will route to in automatic mode, to route the sequenced trunk between two sequenced ends of the flow, and to remove the trunk between one or more sequenced end of the flow using the same shape or component extension used during breakout creation.

Accordingly, embodiments of the routing process described herein may provide a user with a semi-automatic method of sequencing and breaking out complex interfaces between two components. Before ever routing any of the breakout connections, the user may use the sequenced flow to easily evaluate and fix potential crossing situations. The cross resolution may be solved by changing the flow sequence, switching the exit side of the component or swapping pins within the components. The user may then use the automatic breakout engine to quickly implement a test route breakout for the given sequence. Using test route breakout, the user can continue to refine the bundle sequence until they obtain the desired breakout. This may take a fraction of the time that it takes to do using the current manual methodology.

In some embodiments, the routing process described herein may extend the definition of bundles as defined in U.S. Pat. No. 7,536,665 to include sequencing of the rats that make up the bundle. Since flows are built on top of bundles, they will also benefit from this invention. This sequencing of the rats within the bundle provides a definitive order to how the rats enter and leave the bundle thus allowing for the creation of a display showing the correct spacing of the bundle rakes as they enter and exit the bundle ends. In this way, routing process 10 may provide the user with the ability to quickly detect actual or potential crosses at each end of the bundle and route to the sequence. A series of commands may be implemented to enable the user to create, delete and manipulate the bundle sequence. The route engine may also be enhanced to support routing to the defined bundle sequence and commands may be added to allow the user to route the sequenced bundles. In some embodiments, the automatic routing design rule checker may be enhanced to detect sequence routing violations.

Figure 17:
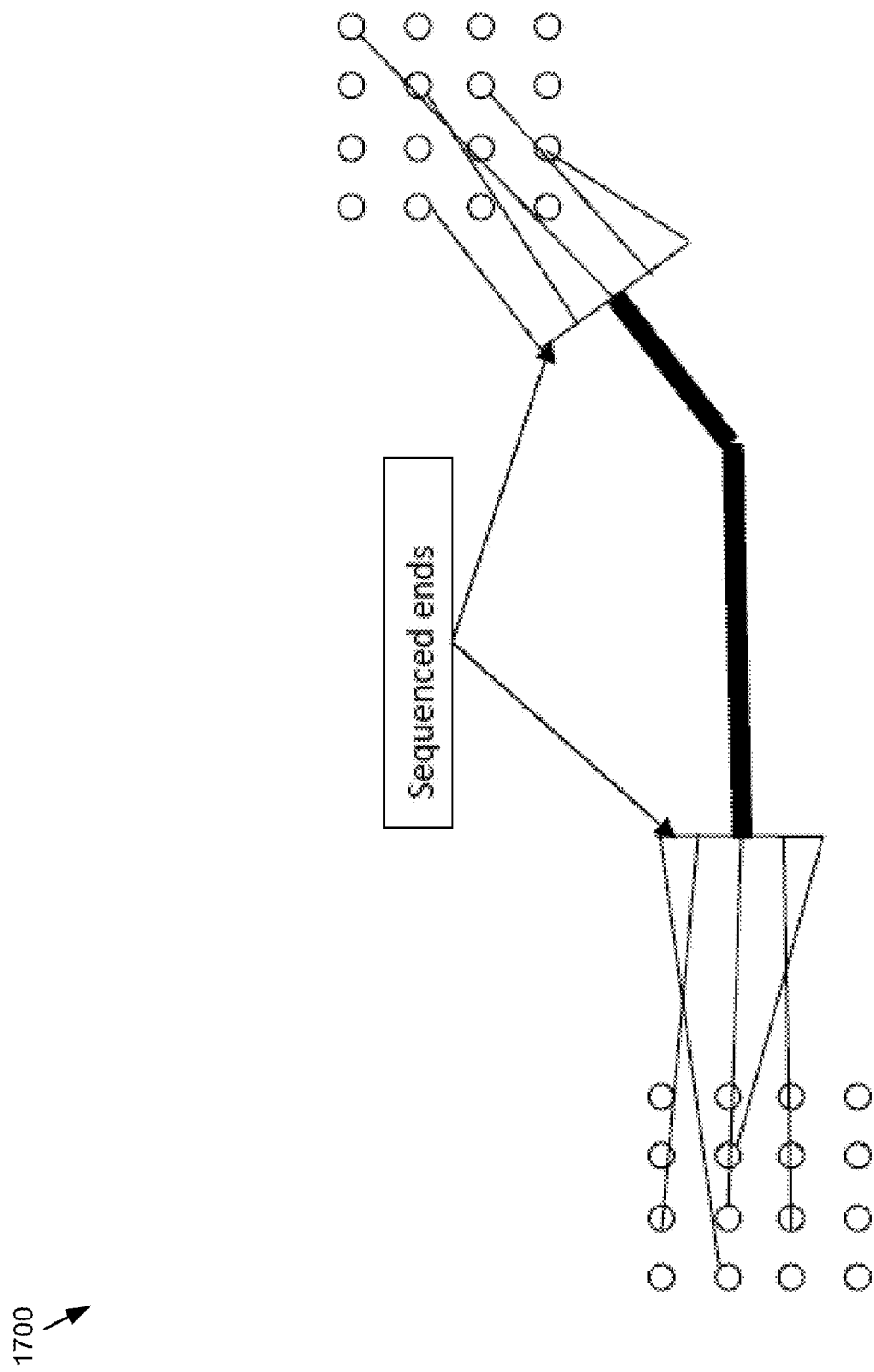
FIG. 17 is a schematic depicting aspects of the routing process in accordance with an embodiment of the present disclosure.
Figure 18:
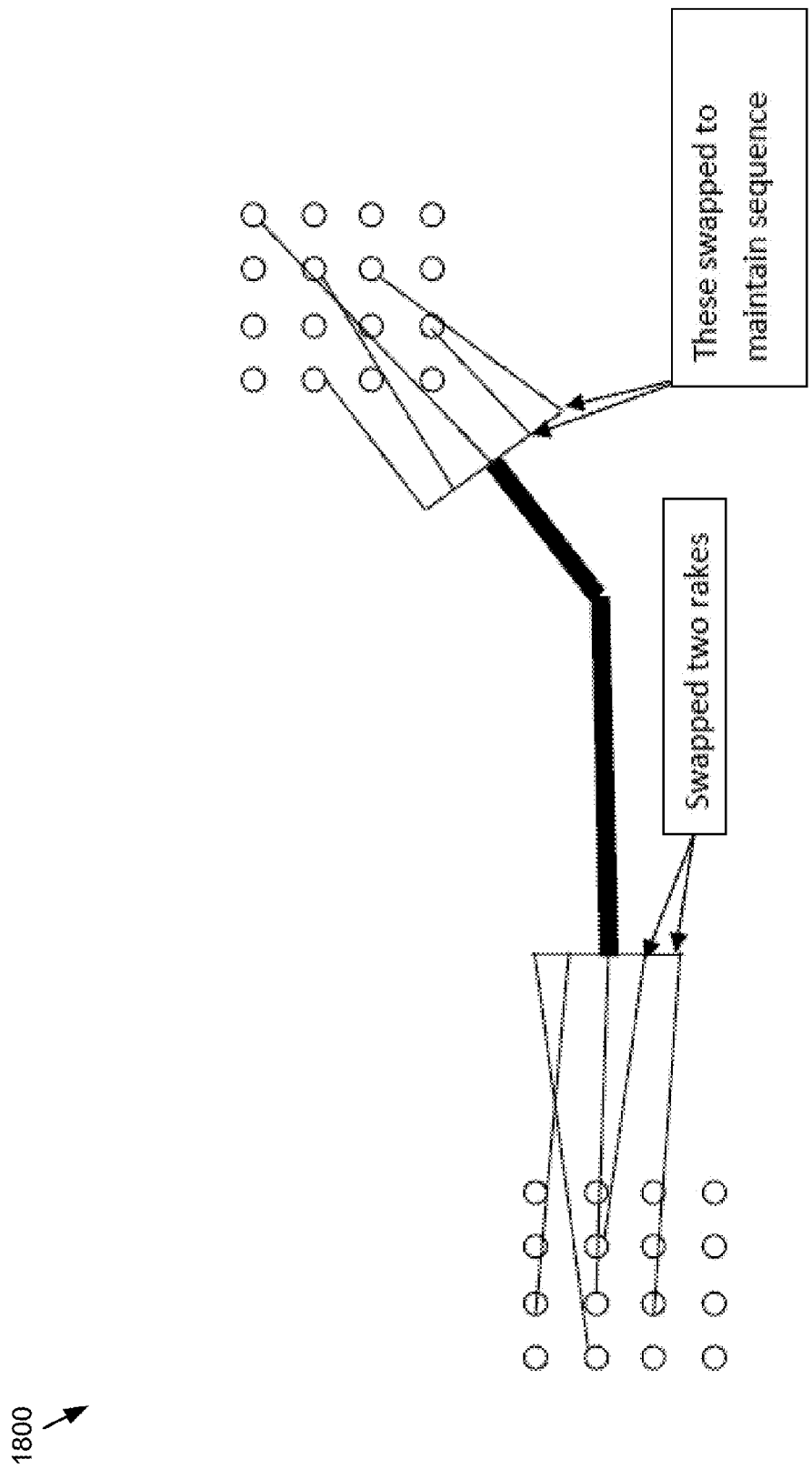
FIG. 18 is a schematic depicting aspects of the routing process in accordance with an embodiment of the present disclosure.
Figure 19:
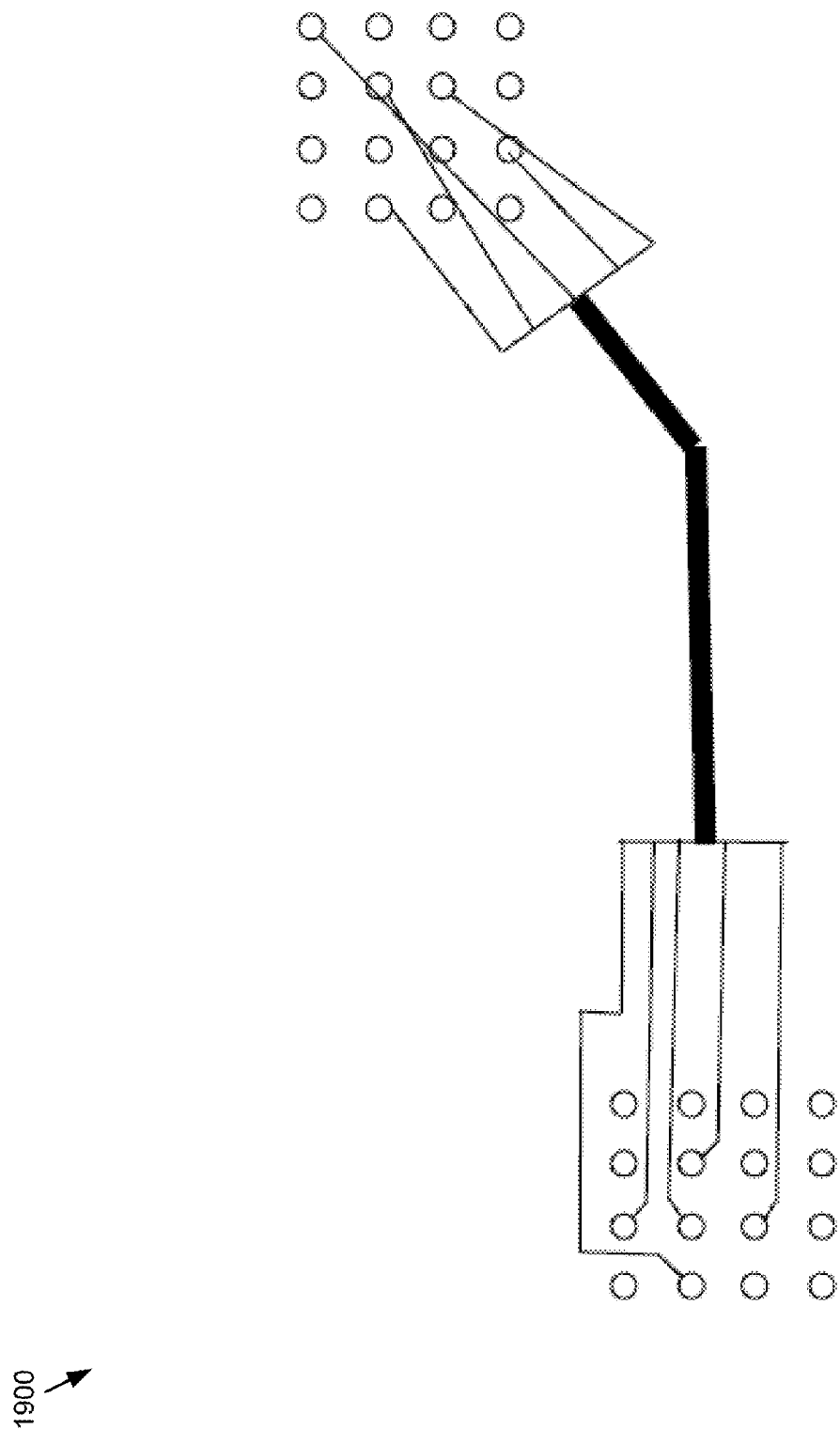
FIG. 19 is a schematic depicting aspects of the routing process in accordance with an embodiment of the present disclosure.
Figure 20:
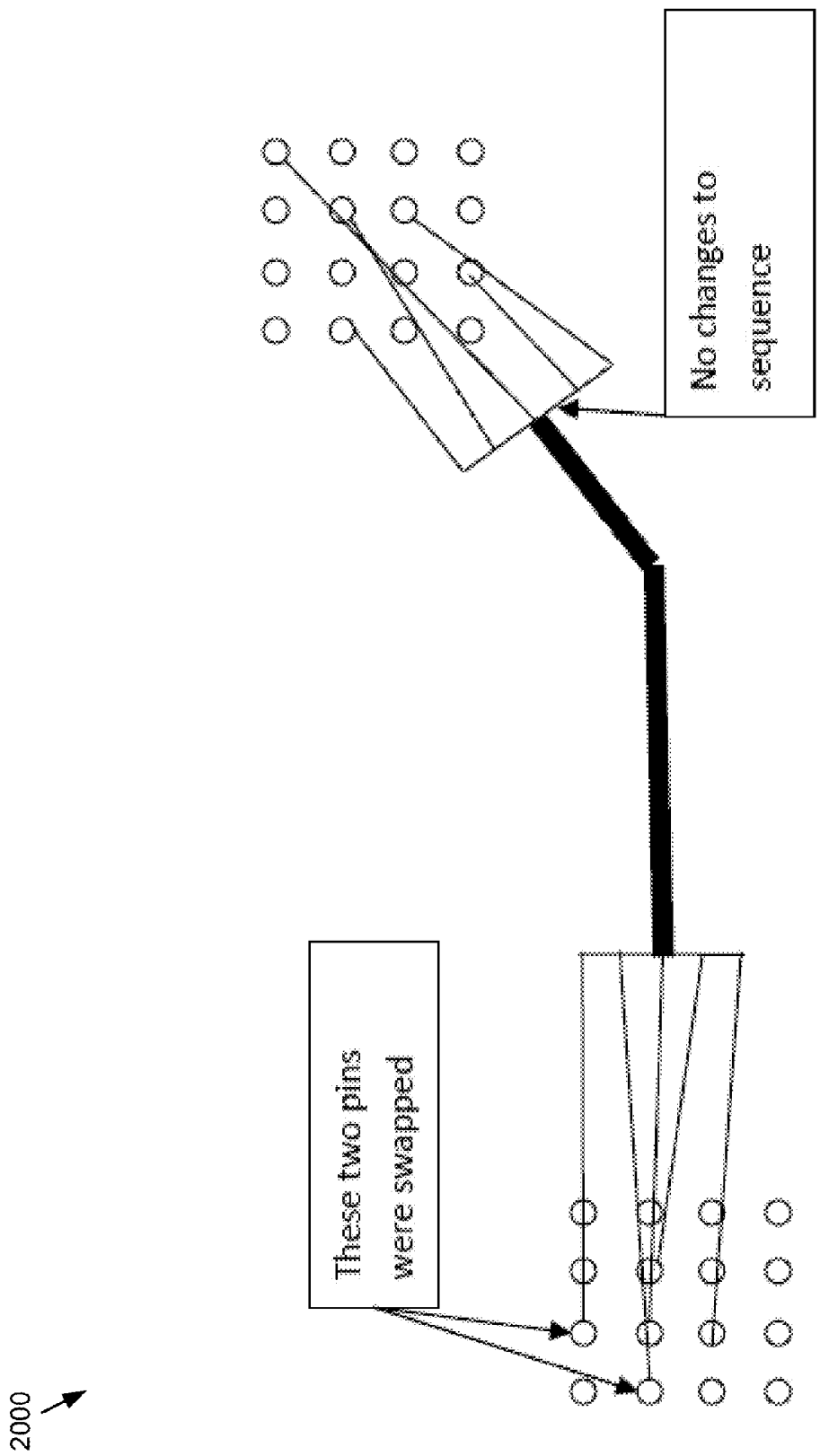
FIG. 20 is a schematic depicting aspects of the routing process in accordance with an embodiment of the present disclosure.
Figure 21:
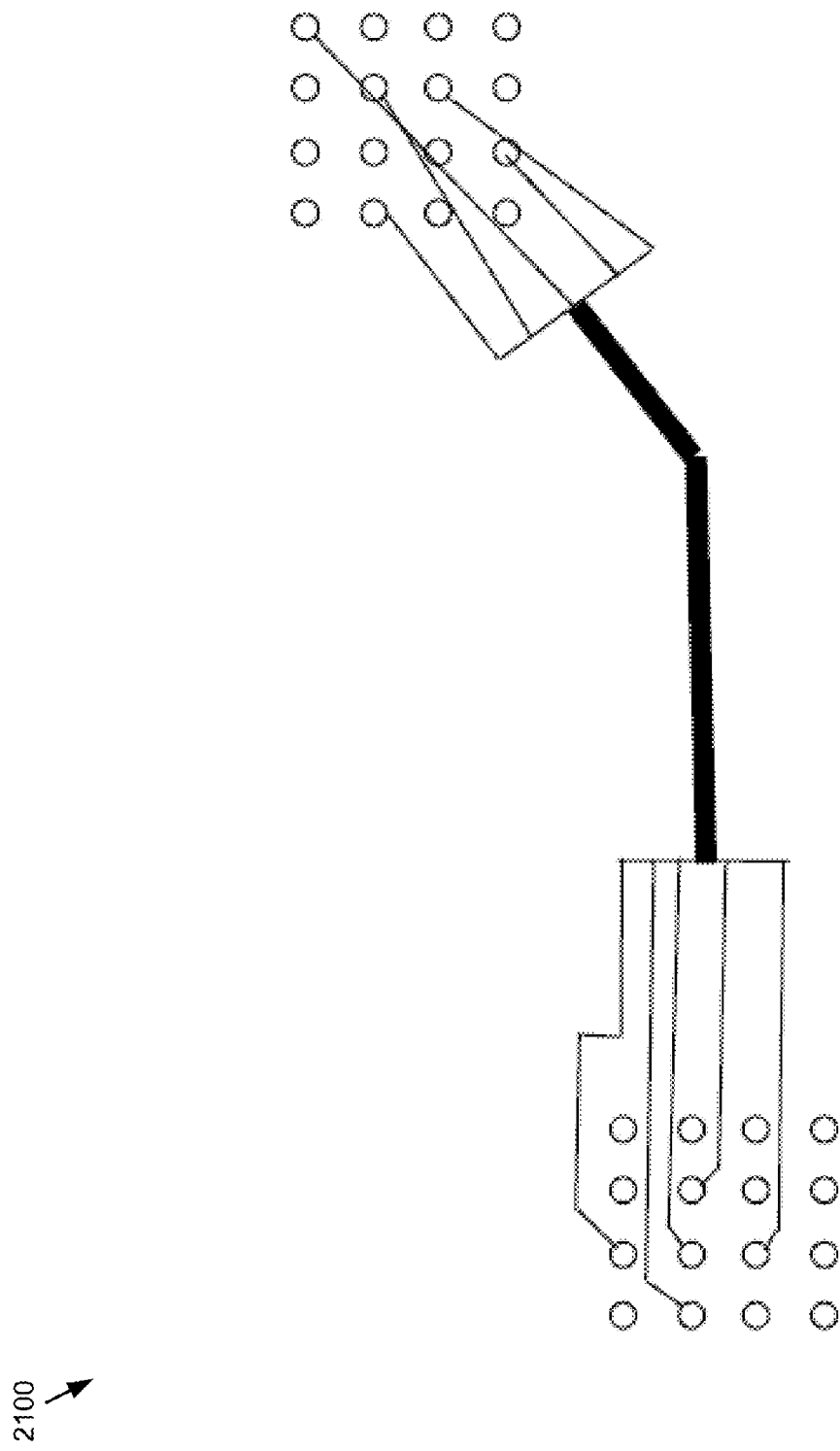
FIG. 21 is a schematic depicting aspects of the routing process in accordance with an embodiment of the present disclosure.

Referring now to FIG. 17, an embodiment of the routing process using the new flow sequence methodology upon the same flow as defined above is shown. In this particular example, the rakes are now sequenced and spaced design rule correct along the leading and trailing edges of the flow. As shown in FIG. 18, upon swapping a couple of the rakes, the flow appears more routable because of less crossings. If a user swaps a rake at one end of flow, routing process 10 may be configured to automatically adjust at the other end to insure the sequence is met. The only potential cross on the left side can be seen to go around the rake it is crossing with. In this way, routing process 10 may allow a user to focus on routing only one end at a time now that there is a defined sequence. FIG. 19 shows the actual routed left end of the flow with rakes at right end. If the pins on the left component were swappable, a user could swap them further cleaning up the routing as shown in FIGS. 20-21. The actual routing of each end of the flow may be performed manually, automatically or using a hybrid combination of both since the route engine must behave to a defined sequence.

In some embodiments, routing process 10 may employ a number of commands, which may be configured to allow a user to create, remove, and/or manipulate sequenced rats within a bundle via one or more selectable options. Some of these may include, but are not limited to, a method to hover over the end of a bundle and have a menu appear that allows a user to define the sequence by selecting objects such as pins, vias, rats, clines, etc, a method to hover over the end of a sequenced bundle and have a menu appear that allows a user to delete the sequence, a method to hover over the end of a sequenced bundle and have a menu appear that allows a user to swap sequence locations within the defined sequence, a method to hover over the end of a sequenced bundle and have a menu appear that allows a user to choose to route one or both ends of the bundle, a method to hover over a bundle and have a menu appear that allows a user to choose to route the trunk, a method to hover over a bundle and have a menu appear that allows a user to choose to delete the trunk and have it trim back to the breakout definition, a method of associating a shape to the bundle end to be used for routing/trimming of the breakout, etc.

In some embodiments, the basis for how the breakout route engine works is to describe to it the legal locations it is allowed to choose and use a cost routing methodology to resolve to completion. The cost routing methodology is discussed in further detail in U.S. Pat. No. 7,937,681 assigned to the assignee of the present disclosure, which is incorporated by reference herein in its entirety. Accordingly, an internal routing boundary box may be defined using parameters or existing shapes. The boundary box may be used to stop expansion of routing once the wavefront has left the box. Internal routing sequence lines may be created to establish legal locations that when the wavefront crosses them can be considered a successful path for a breakout. The lowest cost breakout may actually become the finished route path. Wavefront probes that exit the boundary box but that do not cross a sequence line may be terminated from further expansion.

Figure 22:
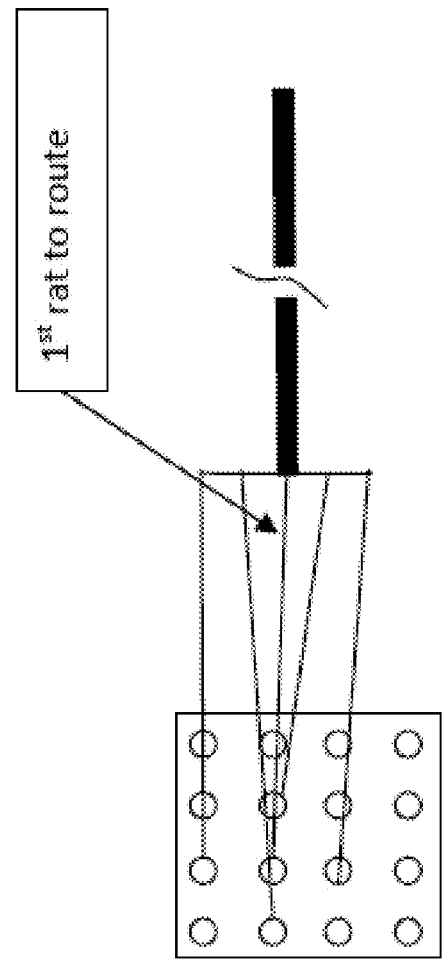
FIG. 22 is a schematic depicting aspects of the routing process in accordance with an embodiment of the present disclosure.
Figure 23:
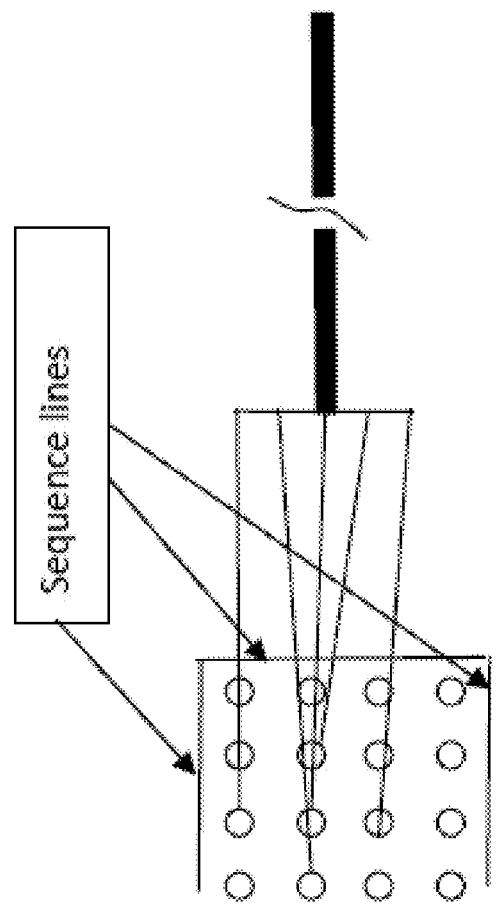
FIG. 23 is a schematic depicting aspects of the routing process in accordance with an embodiment of the present disclosure.
Figure 24:
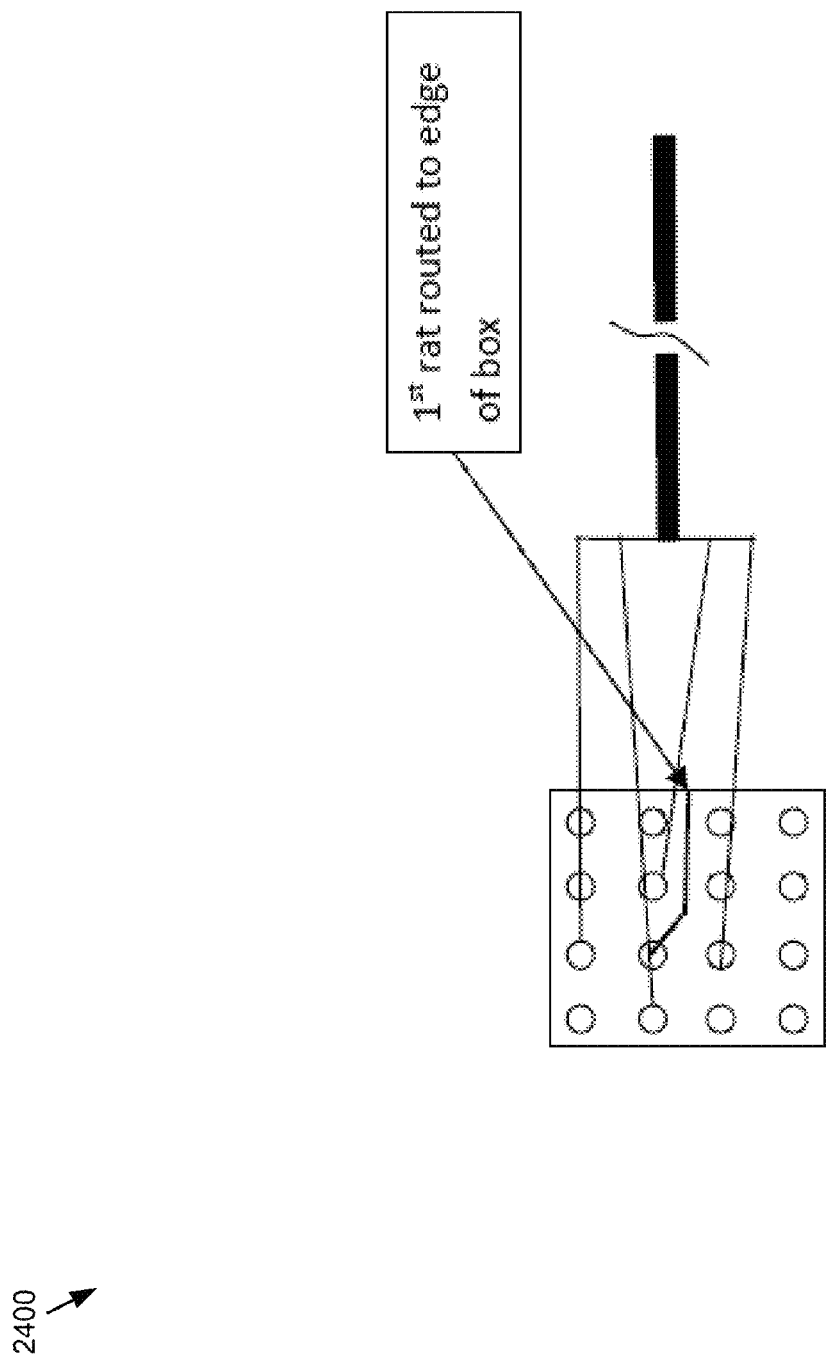
FIG. 24 is a schematic depicting aspects of the routing process in accordance with an embodiment of the present disclosure.
Figure 25:
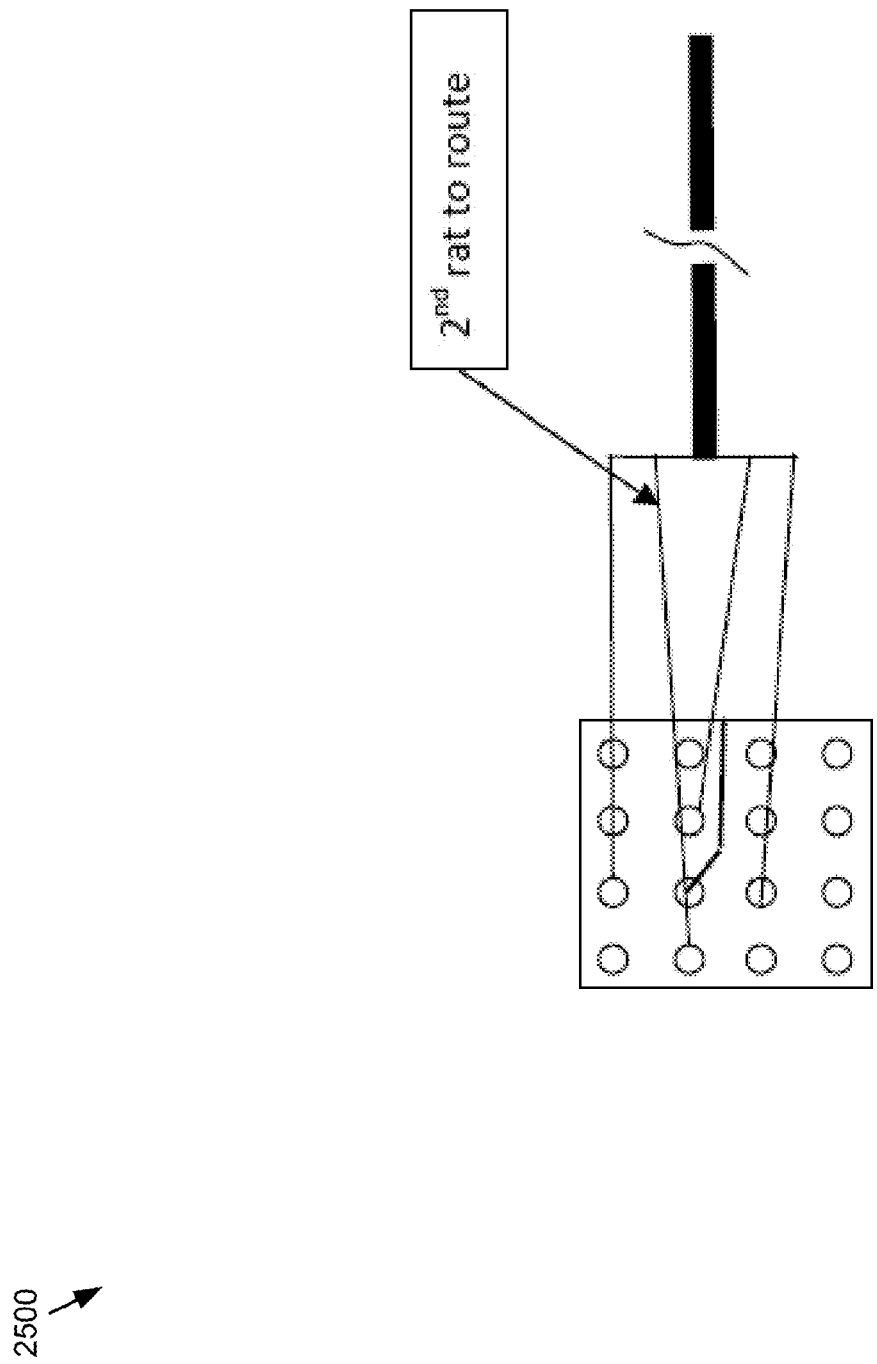
FIG. 25 is a schematic depicting aspects of the routing process in accordance with an embodiment of the present disclosure.
Figure 26:
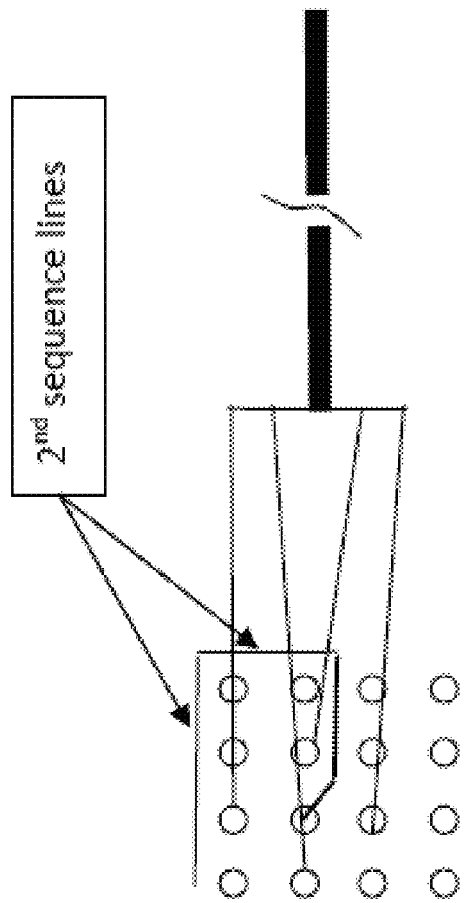
FIG. 26 is a schematic depicting aspects of the routing process in accordance with an embodiment of the present disclosure.
Figure 27:
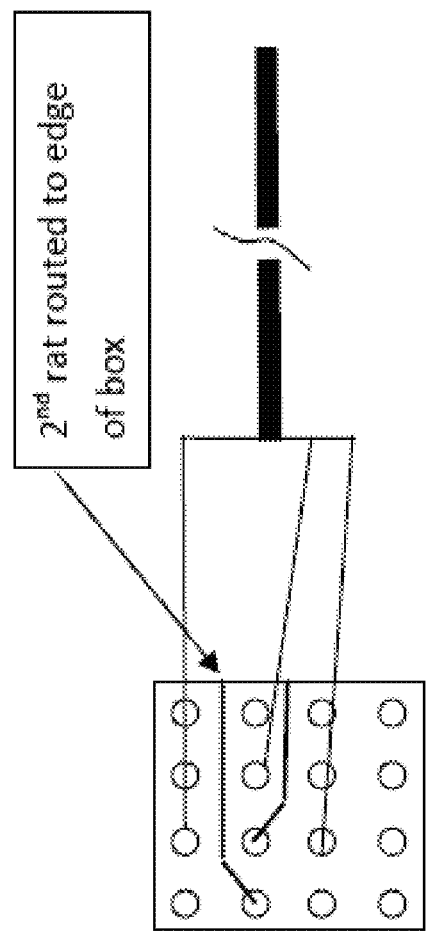
FIG. 27 is a schematic depicting aspects of the routing process in accordance with an embodiment of the present disclosure.

Referring now to FIGS. 22-27, an embodiment consistent with the routing process described herein is depicted. As shown in FIG. 22, in this particular example, the rats order may be computed and the first rat may begin setup to route. Additionally and/or alternatively, the routing boundary box may be created around the component for the first rat. FIG. 23 shows the installation of the routing sequence lines for the first rat and FIG. 24 shows the completion of the routing of the first rat. As shown in FIG. 25, the routing boundary box may be created around the component for nth rat and routing sequence lines may be installed for the nth rat as shown in FIG. 26. Completion of the routing of the nth rat is shown in FIG. 27. For each remaining rat to be routed, the routing process may iteratively repeat one or more of the above operations for each remaining rat to be routed.

In some embodiments, EDA application 20 may be configured to perform testbench automation, reuse, and analysis to verify designs from the system level, through RTL, to the gate level. EDA application 20 may support a metric-driven approach and may utilize a native-compiled architecture in order to speed the simultaneous simulation of transaction-level, behavioral, low-power, RTL, and gate-level models.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support one or more software extensions, which may provide a high-throughput channel between the testbench and the device under test (DUT), and enable automated metric driven verification of embedded software exactly as if it were another part of the DUT.

Accordingly, EDA application 20 may be configured to fuel testbench automation, analysis, and reuse for increased productivity. EDA application 20 may be configured to ensure verification quality by tracking industry-standard coverage metrics, including functional, transactional, low-power, and HDL code, plus automatic data and assertion checking EDA application 20 may be configured to drive and/or guide verification with an automatically backannotated and executable verification plan. EDA application 20 may be configured to create reusable sequences and multi-channel virtual sequences on top of a multi-language verification environment and to configure existing Universal Verification Components (UVCs) or quickly constructs all-new UVCs. EDA application 20 may be configured to enable advanced debug for transaction-level models, SystemVerilog/e class libraries, transient mixed-signal, low-power, and traditional waveform analysis.

In some embodiments, EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for routing in an electronic circuit design comprising:
    assigning, using one or more computing devices, a plurality of rats interconnecting one or more terminals associated with a layout of the electronic circuit design to a bundle;
    sequencing, using the one or more computing devices, the plurality of rats within the assigned bundle to generate a defined sequence of rats within the assigned bundle, wherein sequencing involves altering an initial assignment of the plurality of rats;
    performing one or more bundle rake swaps associated with the electronic circuit design;
    visually displaying updates of the one or more bundle rake swaps via a flow rake display after the one or more bundle rake swaps are performed; and
    routing, using the one or more computing devices, the plurality of rats between the one or more terminals, based upon, at least in part, the defined sequence of rats and the one or more bundle rake swaps.

2. The computer-implemented method of claim 1, further comprising:
    providing a user with an option associated with the defined sequence of rats, the option including at least one of creating, deleting, and manipulating the defined sequence of rats.

3. The computer-implemented method of claim 2, further comprising:
    providing a user with an option to select at least one of a pin, via, rat, and cline in contact with the defined sequence of rats.

4. The computer-implemented method of claim 1, further comprising:
    determining if the defined sequence of rats satisfies at least one design rule.

5. The computer-implemented method of claim 1, further comprising:
    providing a user with routing options associated with the electronic circuit design, the routing options including at least two of a manual routing option, an automatic routing option, and a hybrid routing option.

6. The computer-implemented method of claim 1, further comprising:
    providing a user with an option to associate a shape with at least one aspect of the defined sequence of rats.

7. The computer-implemented method of claim 1, wherein sequencing includes generating a display configured to indicate at least one crossing pattern associated with the defined sequence of rats prior to routing.

8. A computer-readable storage medium for routing in an electronic circuit design, the computer-readable storage medium having stored thereon instructions that when executed by a machine result in the following operations:
    assigning, using one or more computing devices, a plurality of rats interconnecting one or more terminals associated with a layout of the electronic circuit design to a bundle;
    sequencing, using the one or more computing devices, the plurality of rats within the assigned bundle to generate a defined sequence of rats within the assigned bundle, wherein sequencing involves altering an initial assignment of the plurality of rats;
    performing one or more bundle rake swaps associated with the electronic circuit design;
    visually displaying updates of the one or more bundle rake swaps via a flow rake display after the one or more bundle rake swaps are performed; and
    routing, using the one or more computing devices, the plurality of rats between the one or more terminals, based upon, at least in part, the defined sequence of rats and the one or more bundle rake swaps.

9. The computer-readable storage medium of claim 8, further comprising:
    providing a user with an option associated with the defined sequence of rats, the option including at least one of creating, deleting, and manipulating the defined sequence of rats.

10. The computer-readable storage medium of claim 9, further comprising:

providing a user with an option to select at least one of a pin, via, rat, and cline in contact with the defined sequence of rats.

11. The computer-readable storage medium of claim 8, further comprising:
determining if the defined sequence of rats satisfies at least one design rule.

12. The computer-readable storage medium of claim 8, further comprising:
providing a user with routing options associated with the electronic circuit design, the routing options including at least two of a manual routing option, an automatic routing option, and a hybrid routing option.

13. The computer-readable storage medium of claim 8, further comprising:
providing a user with an option to associate a shape with at least one aspect of the defined sequence of rats.

14. The computer-readable storage medium of claim 8, wherein sequencing includes generating a display configured to indicate at least one crossing pattern associated with the defined sequence prior to routing.

15. A system for routing in an electronic circuit design comprising:
a computing device having at least one processor configured to simulate an electronic design, the at least one processor further configured to assign a plurality of rats interconnecting one or more terminals associated with a layout of the electronic circuit design to a bundle, the at least one processor further configured to sequence the plurality of rats within the assigned bundle to generate a defined sequence of rats within the assigned bundle, wherein sequencing involves altering an initial assignment of the plurality of rats, the at least one processor further configured to perform one or more bundle rake swaps associated with the electronic circuit design and visually display updates of the one or more bundle rake swaps via a flow rake display after the one or more bundle rake swaps are performed, the at least one processor further configured to route the plurality of rats between the one or more terminals, based upon, at least in part, the defined sequence of rats and the one or more bundle rake swaps.

16. The system of claim 15, wherein the at least one processor is further configured to provide a user with an option associated with the defined sequence of rats, the option including at least one of creating, deleting, and manipulating the defined sequence of rats.

17. The system of claim 15, wherein the at least one processor is further configured to determine if the defined sequence of rats satisfies at least one design rule.

18. The system of claim 15, wherein the at least one processor is further configured to provide a user with a routing options associated with the electronic circuit design, the routing options including at least two of a manual routing option, an automatic routing option, and a hybrid routing option.

19. The system of claim 15, wherein the at least one processor is further configured to provide a user with an option to select at least one of a pin, via, rat, and cline in contact with the defined sequence of rats.

20. The system of claim 15, wherein the at least one processor is further configured to provide a user with an option to associate a shape with at least one aspect of the defined sequence of rats.

21. A computer-implemented method for routing in an electronic circuit design comprising:
assigning, using one or more computing devices, a plurality of rats interconnecting one or more terminals associated with a layout of the electronic circuit design to a bundle;
sequencing, using the one or more computing devices, the plurality of rats within the assigned bundle to generate a defined sequence of rats within the assigned bundle, wherein sequencing involves altering an initial assignment of the plurality of rats;
performing one or more bundle rake swaps associated with the electronic circuit design;
performing one or more pin swaps associated with the electronic circuit design;
visually displaying updates of the one or more bundle rake swaps and the one or more pin swaps via a flow rake display after the one or more bundle rake swaps and the one or more pin swaps are performed; and
routing, using the one or more computing devices, the plurality of rats between the one or more terminals, based upon, at least in part, the defined sequence of rats, the one or more bundle rake swaps, and the one or more pin swaps.

* * * * *